(12) United States Patent
Kaufmann et al.

(10) Patent No.: US 8,643,164 B2
(45) Date of Patent: Feb. 4, 2014

(54) PACKAGE-ON-PACKAGE TECHNOLOGY FOR FAN-OUT WAFER-LEVEL PACKAGING

(75) Inventors: Matthew Vernon Kaufmann, Morgan Hill, CA (US); Teck Yang Tan, Singapore (SG)

(73) Assignee: Broadcom Corporation, Irvine, CA (US)

( * ) Notice: Subject to any disclaimer, the term of this patent is extended or adjusted under 35 U.S.C. 154(b) by 338 days.

(21) Appl. No.: 12/512,313

(22) Filed: Jul. 30, 2009

(65) Prior Publication Data

US 2010/0314739 A1    Dec. 16, 2010

Related U.S. Application Data

(60) Provisional application No. 61/186,044, filed on Jun. 11, 2009.

(51) Int. Cl.
*H01L 23/02* (2006.01)
(52) U.S. Cl.
USPC .............. 257/686; 257/692; 257/E21.499
(58) Field of Classification Search
USPC .......... 257/686, 692, 678, 777, 778, E21.499, 257/E23.068, E25.027; 438/107, 106
See application file for complete search history.

(56) References Cited

U.S. PATENT DOCUMENTS

| 5,111,278 | A  | * | 5/1992  | Eichelberger ................ 257/698 |
| 5,442,234 | A  |   | 8/1995  | Liang |
| 5,818,105 | A  |   | 10/1998 | Kouda |
| 6,154,366 | A  |   | 11/2000 | Ma et al. |
| 6,271,469 | B1 |   | 8/2001  | Ma et al. |
| 6,506,632 | B1 | * | 1/2003  | Cheng et al. .................. 438/126 |
| 6,617,674 | B2 |   | 9/2003  | Becker et al. |
| 6,709,898 | B1 |   | 3/2004  | Ma et al. |
| 6,734,534 | B1 |   | 5/2004  | Vu et al. |
| 6,750,397 | B2 | * | 6/2004  | Ou et al. ....................... 174/524 |
| 6,867,122 | B2 |   | 3/2005  | Weng |
| 6,946,325 | B2 | * | 9/2005  | Yean et al. .................... 438/112 |
| 6,965,160 | B2 |   | 11/2005 | Cobbley et al. |

(Continued)

FOREIGN PATENT DOCUMENTS

| JP | 2004 214345 A | 7/2004 |
| KR | 101998703571  | 11/1998 |
| WO | 9631905 A1    | 10/1996 |

OTHER PUBLICATIONS

European Search Report Received for EP Patent Application No. 08006073.4, mailed on Sep. 19, 2012, 8 pages.

*Primary Examiner* — Chuong A Luu
*Assistant Examiner* — NGA Doan
(74) *Attorney, Agent, or Firm* — Fiala & Weaver P.L.L.C.

(57) ABSTRACT

Methods, systems, and apparatuses for wafer-level package-on-package structures are provided herein. A wafer-level integrated circuit package that includes at least one die is formed. The wafer-level integrated circuit package includes redistribution interconnects that redistribute terminals of the die over an area that is larger than an active-surface of the die. Electrically conductive paths are formed from the redistribution interconnects at a first surface of the wafer-level integrated circuit package to electrically conductive features at a second surface of the wafer-level integrated circuit package. A second integrated circuit package may be mounted to the second surface of the wafer-level integrated circuit package to form a package-on-package structure. Electrical mounting members of the second package may be coupled to the electrically conductive features at the second surface of the wafer-level integrated circuit package to provide electrical connectivity between the packages.

20 Claims, 24 Drawing Sheets

(56) References Cited

U.S. PATENT DOCUMENTS

| | | |
|---|---|---|
| 7,002,245 B2 * | 2/2006 | Huang et al. .................. 257/701 |
| 7,170,152 B2 | 1/2007 | Huang et al. |
| 7,268,012 B2 | 9/2007 | Jiang et al. |
| 7,294,920 B2 * | 11/2007 | Chen et al. .................... 257/698 |
| 7,453,148 B2 * | 11/2008 | Yang et al. .................... 257/734 |
| 7,834,449 B2 | 11/2010 | Kaufmann et al. |
| 7,872,347 B2 | 1/2011 | Kaufmann |
| 2002/0020855 A1 | 2/2002 | Hwang |
| 2003/0153172 A1 | 8/2003 | Yajima et al. |
| 2005/0205978 A1 * | 9/2005 | Pu et al. ........................ 257/678 |
| 2006/0258137 A1 | 11/2006 | Ke et al. |
| 2006/0264021 A1 | 11/2006 | Farahani et al. |
| 2007/0035015 A1 * | 2/2007 | Hsu ................................ 257/723 |
| 2008/0182401 A1 | 7/2008 | Ke et al. |
| 2008/0265408 A1 | 10/2008 | Kaufmann et al. |
| 2009/0039508 A1 | 2/2009 | Kaufmann |

* cited by examiner

1100

1102
attach a non-active surface of each of the plurality of dies to the first surface of the substrate such that the dies are spaced apart on the substrate in a predetermined arrangement 1104
form a substantially planar layer of an insulating material on the first surface of the substrate to cover the dies on the substrate and to fill a space adjacent to each die on the substrate 1106
form a second plurality of electrically conductive paths through the insulating material 1108
form at least one redistribution interconnect on the insulating material for each die to have a first portion coupled to a terminal of the die and a second portion that extends away from the first portion over a portion of the space adjacent to the die, the second portion being coupled to an electrically conductive path of the second plurality of electrically conductive paths

FIG. 11

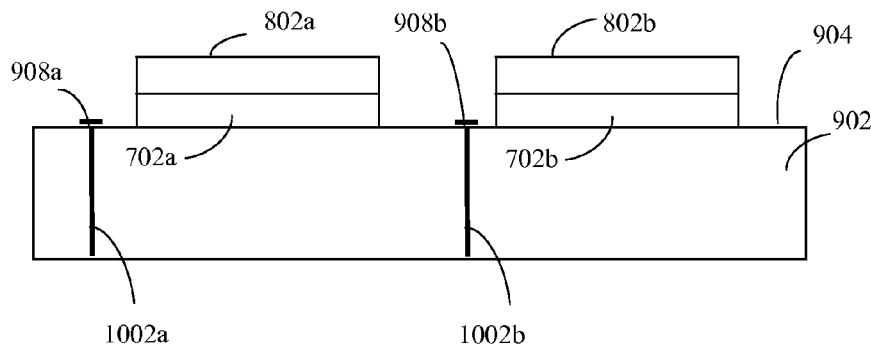

2002 — form a substantially planar layer of a thick film material on the first surface of the substrate 2004 — forming a plurality of openings in the layer of the thick film material 2006 — attach a non-active surface of each of the plurality of dies to the first surface of the substrate in a corresponding opening of the plurality of openings 2008 — form a substantially planar layer of an insulating material over the first surface of the substrate to cover the dies in the openings on the substrate 2010 — form a second plurality of electrically conductive paths through the insulating material 2012 — form at least one redistribution interconnect on the insulating material for each die to have a first portion coupled to a terminal of a respective die and a second portion that extends away from the first portion over a portion of the insulating material, the second portion being coupled to an electrically conductive path of the second plurality of electrically conductive paths

FIG. 20

PACKAGE-ON-PACKAGE TECHNOLOGY FOR FAN-OUT WAFER-LEVEL PACKAGING

This application claims the benefit of U.S. Provisional Application No. 61/186,044, filed on Jun. 11, 2009, which is incorporated by reference herein in its entirety.

BACKGROUND OF THE INVENTION

1. Field of the Invention

The present invention relates to integrated circuit packaging technology, and more particularly to package-on-package technology.

2. Background Art

Integrated circuit (IC) chips or dies are typically interfaced with other circuits using a package that can be attached to a printed circuit board (PCB). One such type of IC die package is a ball grid array (BGA) package. BGA packages provide for smaller footprints than many other package solutions available today. A BGA package has an array of solder ball pads located on a bottom external surface of a package substrate. Solder balls are attached to the solder ball pads. The solder balls are reflowed to attach the package to the PCB.

An advanced type of BGA package is a wafer-level BGA package. Wafer-level BGA packages have several names in industry, including wafer level chip scale packages (WLCSP), among others. In a wafer-level BGA package, the solder balls are interfaced with the IC chip when the IC chip has not yet been singulated from its fabrication wafer. Wafer-level BGA packages can therefore be made very small, with high pin out, relative to other IC package types including traditional BGA packages.

A current move to tighter fabrication process technologies, such as 65 nm, with a continuing need to meet strict customer reliability requirements and ongoing cost pressures, is causing difficulties in implementing wafer-level BGA package technology. For example, due to the small size of the die used in wafer-level BGA packages, in some cases there is not enough space to accommodate all of the package pins at the pin pitch required for the end-use application. Furthermore, it is desired to include additional functionality in wafer-level BGA packages. Including additional functionality in wafer-level BGA packages is difficult due to their small size.

Multiple integrated circuit packages may be stacked upon one another to provide additional functionality in a package-on-package (POP) structure. However, POP assembly techniques are difficult to implement in small integrated circuit packages. For example, current POP assembly techniques are not applicable to wafer-level integrated circuit packages.

BRIEF SUMMARY OF THE INVENTION

Methods, systems, and apparatuses for wafer-level integrated circuit (IC) packages are described. In particular, techniques for wafer-level package-on-package structures are provided herein. A wafer-level integrated circuit package that includes at least one die is formed. The wafer-level integrated circuit package includes redistribution interconnects that redistribute terminals of the die over an area that is larger than an active-surface of the die. Electrically conductive paths are formed from the redistribution interconnects at a first surface of the wafer-level integrated circuit package to electrically conductive features at a second surface of the wafer-level integrated circuit package. A second integrated circuit package may be mounted to the second surface of the wafer-level integrated circuit package to form a package-on-package structure. Electrical mounting members of the second package may be coupled to the electrically conductive features at the second surface of the wafer-level integrated circuit package to provide electrical connectivity between the packages.

In a first implementation, a method for forming integrated circuit (IC) package structures is provided. A first plurality of electrically conductive features is formed on a first surface of a substrate. A first plurality of electrically conductive paths is formed through the substrate that is electrically coupled to the first electrically conductive features on the first surface of the substrate. A non-active surface of each of a plurality of integrated circuit dies is attached to the first surface of the substrate. Each integrated circuit die includes an integrated circuit region having a plurality of terminals. A substantially planar layer of an insulating material is formed over the first surface of the substrate to cover the dies on the substrate. A second plurality of electrically conductive paths is formed through the insulating material. A second plurality of electrically conductive features is formed on a second surface of the substrate. At least one redistribution interconnect is formed on the insulating material for each die of the plurality of dies. Each redistribution interconnect has a first portion coupled to a terminal of a respective die and a second portion that extends away from the first portion over a portion of the insulating material adjacent to the respective die. The second portion is coupled to an electrically conductive path of the second plurality of electrically conductive paths. A ball interconnect is coupled to each second portion. The dies are singulated into a plurality of first integrated circuit packages that each includes a die of the plurality of dies and the portion of the insulating material adjacent to the included die. A respective second integrated circuit package is mounted to each of the plurality of first integrated circuit packages to form a plurality of package-on-package structures.

In a further aspect, a substantially planar layer of a thick film material may be formed on the first surface of the substrate. A plurality of openings may be formed in the layer of the thick film material. During the attaching of the dies to the substrate, a non-active surface of each of the plurality of dies may be attached to a first surface of a substrate in a corresponding opening of the plurality of openings. In such an implementation, the substantially planar layer of insulating material is formed on the layer of the thick film material to cover the dies in the openings on the substrate. The dies may be singulated into the plurality of integrated circuit packages that each includes a die of the plurality of dies, the portion of the insulating material adjacent to the included die, and a portion of the thick film material adjacent to the included die.

In a still further aspect, a method of forming the redistribution interconnects on the insulating material is provided. A plurality of first vias is formed through the substantially planar layer of the insulating material to provide access to the plurality of terminals. A plurality of redistribution interconnects is formed on the substantially planar layer of the insulating material. The first portion of each redistribution interconnect is in contact with a respective terminal though a respective first via. A second layer of insulating material is formed over the substantially planar layer of insulating material and the plurality of redistribution interconnects. The plurality of second vias is formed through the second layer of insulating material to provide access to the second portion of each of the plurality of redistribution interconnects. A plurality of under bump metallization layers is formed on the second layer of insulating material such that each under bump metallization layer is in contact with the second portion of a respective redistribution interconnect though a respective second via.

In a still further aspect, the second integrated circuit packages may be mounted to each of the plurality of first integrated circuit packages by coupling electrical mounting members of each second integrated circuit package to the second plurality of electrically conductive features of a corresponding first integrated circuit package to form the plurality of package-on-package structures.

In another implementation, an integrated circuit (IC) package structure is provided. The package structure includes a first integrated circuit package and a second integrated circuit package. The first integrated circuit package includes an integrated circuit die, a substrate, a first layer of an insulating material, first and second electrically conductive paths, a redistribution interconnect, and a ball interconnect. The integrated circuit die has a plurality of terminals on a first surface of the integrated circuit die. The substrate has opposing first and second surfaces. The first surface of the substrate has a first electrically conductive feature. The second surface of the substrate has a second electrically conductive feature. The first electrically conductive path is through the substrate from the first electrically conductive feature to the second electrically conductive feature. The second surface of the integrated circuit die is attached to the first surface of the substrate. The first layer of insulating material covers the first surface of the die and the first electrically conductive feature, and fills a space adjacent to at least one side of the die on first surface of the substrate. The second electrically conductive path is through the insulating material, and is coupled to the first electrically conductive feature. The redistribution interconnect is on the first layer of the insulating material, and includes a first portion and a second portion. The first portion is coupled to a terminal of the die through the first layer. The second portion extends away from the first portion over the insulating material that fills the space adjacent to the die. The second portion is coupled to the second electrically conductive path. The ball interconnect is coupled to the second portion of the redistribution interconnect. The second integrated circuit package is mounted to the first integrated circuit package.

In a further aspect, the first integrated circuit package may include a substantially planar thick film material that is attached to the first surface of the substrate. The thick film material forms an opening. The integrated circuit die is positioned in the opening on the first surface of the substrate. The first layer of insulating material covers the first surface of the die, the first electrically conductive feature, and a surface of the thick film material, and fills a space adjacent to the die in the opening.

In another implementation, a wafer level integrated circuit package structure is provided. The wafer level integrated circuit package structure includes a substrate, a plurality of integrated circuit dies, an insulating material, a first plurality of electrically conductive paths, a second plurality of electrically conductive paths, and a plurality of redistribution interconnects. The substrate has opposing first and second surfaces. The substrate including a first plurality of electrically conductive features on a first surface of a substrate that are coupled by the first plurality of electrically conductive paths through the substrate to a second plurality of electrically conductive features on the second surface of the substrate. The integrated circuit dies each include an integrated circuit region. A non-active surface of each die of the plurality of dies is attached to a first surface of the substrate. An insulating material covers the dies on the substrate. The second plurality of electrically conductive paths is formed through the insulating material. The plurality of redistribution interconnects is on the insulating material. The plurality of redistribution interconnects includes a redistribution interconnect for each die of the plurality of dies having a first portion coupled to a terminal of a respective die and a second portion that extends away from the first portion over a portion of the insulating material adjacent to the respective die. The second portion is coupled to an electrically conductive path of the second plurality of electrically conductive paths.

These and other objects, advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 11 shows a flowchart providing additional steps for a process to form integrated circuit packages, according to an embodiment of the present invention.

FIG. 12 shows a cross-sectional view of dies attached to a first surface of the substrate of FIG. 10, according to an example embodiment.

FIG. 20 shows a flowchart providing additional steps for a process for forming integrated circuit packages, according to an embodiment of the present invention.

Figure 1:
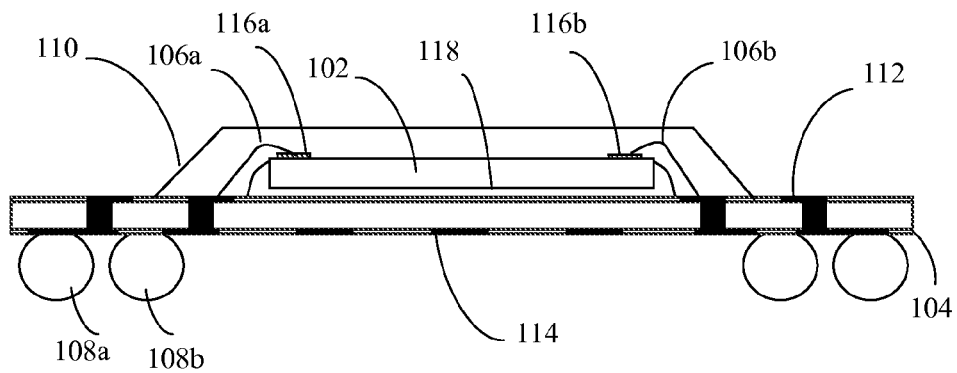
FIG. 1 shows a cross-sectional view of an example BGA package.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

I. Introduction

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

II. Integrated Circuit Packages

Integrated circuit (IC) packages exist that enable IC chips or dies to be interfaced with other circuits using a package that can be attached to a printed circuit board (PCB). One such type of IC die package is a ball grid array (BGA) package. FIG. 1 shows a cross-sectional view of an example BGA package 100. BGA package 100 includes an IC die/chip 102, a substrate 104, bond wires (also known as "wire bonds") 106, a plurality of solder balls 108, and an encapsulating material 110. Substrate 104 has a first (e.g., top) surface 112 that is opposed to a second (e.g., bottom) surface 114 of substrate 104. As shown in FIG. 1, die 102 is mounted to first surface 112 of substrate 104. Die 102 may be mounted to substrate 104 using an adhesive material 118. A plurality of bond wires 106 are coupled between terminals 116 of die 102 and electrically conductive features, such as traces, bond fingers, etc. (not shown in FIG. 1), at first surface 112 of substrate 104. Encapsulating material 110 covers die 102 and bond wires 106 on first surface 112 of substrate 104. A plurality of solder balls 108 (including solder balls 108a and 108b indicated in FIG. 1) is attached to second surface 114 of substrate 104. Solder balls 108 are electrically coupled through substrate 104 (e.g., by electrically conductive vias and/or routing) to the electrically conductive features (e.g., traces, bond fingers, contact regions, etc.) of first surface 112 of substrate 104 to enable signals of die 102 to be electrically connected to solder balls 108.

Figure 2:
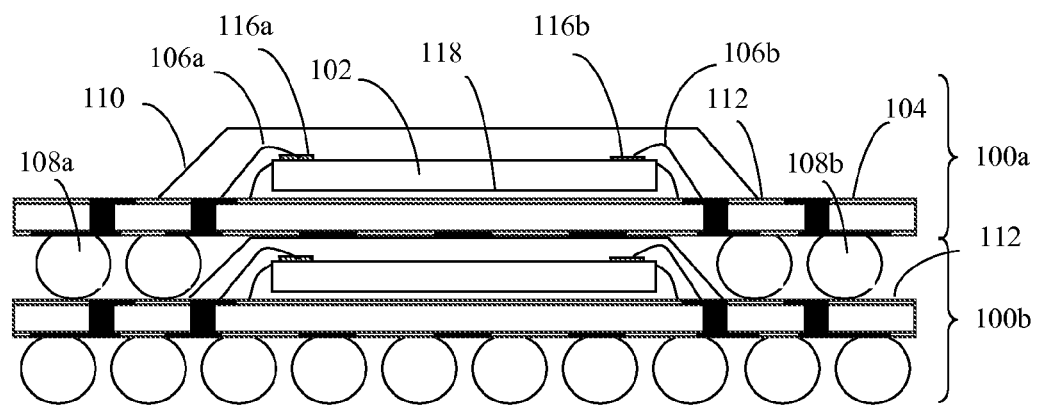
FIG. 2 shows a cross-sectional side view of a package-on-package (POP) structure that includes a first package stacked on a second package.

Package 100 may be stacked with a second integrated circuit package to form a package-on-package structure. For instance, FIG. 2 shows a cross-sectional side view of a package-on-package (POP) structure 200 that includes a first package 100a stacked on a second package 100b. First and second packages 100a and 100b are generally similar to package 100 in FIG. 1. As shown in FIG. 2, solder balls 108 attached to second surface 114 of first package 100a are coupled to electrically conductive features on first surface 112 of second package 100b.

By forming package-on-package structure 200, an IC package structure is formed that includes two IC dies, thereby potentially including enhanced processing capability and/or functionality relative to package 100 shown in FIG. 1. Thus, package-on-package structures are desirable. However, conventional package-on-package structures, such as structure 200 shown in FIG. 2, are bulkier than single package structures, and thus may be more difficult to integrate into products, particularly products in which space allocated for circuits is limited.

III. Wafer Level Packaging

"Wafer-level packaging" is an integrated circuit packaging technology where the packaging-related interconnects are applied while the integrated circuit dies or chips are still in wafer form. Thus, much of the packaging occurs at the wafer-level, which is very cost-effective, because many die of the wafer may be processed at the same time. After the packaging-related interconnects are applied, the wafer may be tested and singulated into individual devices, which may be sent directly to customers for their use. Thus, individual packaging of discreet devices is not required. The size of the final package is essentially the size of the corresponding chip, resulting in a very small package solution. Wafer-level packaging is becoming increasingly popular as the demand for increased functionality in small form-factor devices increases. Examples of applications for wafer-level packages include mobile devices such as cell phones, PDAs, and MP3 players, for example.

The small size of wafer-level packages and the increasing integration of functionality into IC dies are making it increasingly difficult to attach enough pins (e.g., solder balls) to the wafer-level packages so that all desired signals of the dies can be externally interfaced. The pins of a device/package are limited to the surface area of the die. The pins on the die must be sufficiently spaced to allow end-users to surface mount the packages directly to circuit boards. If enough pins cannot be provided on the die, the end products will be unable to take advantage of the low cost and small size of the wafer-level packages. Such products will then need to use conventional IC packaging, which leads to much larger package sizes and is more costly.

IV. Example Embodiments

Embodiments of the present invention enable wafer-level packages to be stacked.

The wafer-level packages are configured to have more pins than can conventionally be fit on a die surface at a pin pitch that is reasonable for the end-use application. Embodiments use routing interconnects to enable pins to be located over a space adjacent to a die, effectively increasing an area of each die. The dies may be stacked, providing a further increase in processing capacity and/or functionality in the resulting package-on-package structure relative to conventional packages. For instance, electrical connections may be formed through the space adjacent to the die of a wafer-level package to enable a second package to be electrically coupled to the wafer-level package. Such embodiments are cost-effective, manufacturable, and enable small size packages to be fabricated having large numbers of pins.

The example embodiments described herein are provided for illustrative purposes, and are not limiting. Although wafer-level ball grid array packages are mainly illustrated in the description below, the examples described herein may be adapted to a variety of types of wafer-level integrated circuit packages and may include applications with more than one integrated circuit die. For instance, a wafer-level package may be formed as described herein that includes two or more dies (e.g., two adjacent integrated circuit regions of a wafer are singulated from the wafer attached together). A second package may be mounted to this multi-die wafer-level package. Further structural and operational embodiments, including modifications/alterations, will become apparent to persons skilled in the relevant art(s) from the teachings herein.

A. Example Wafer Processing Embodiments

Figure 3:
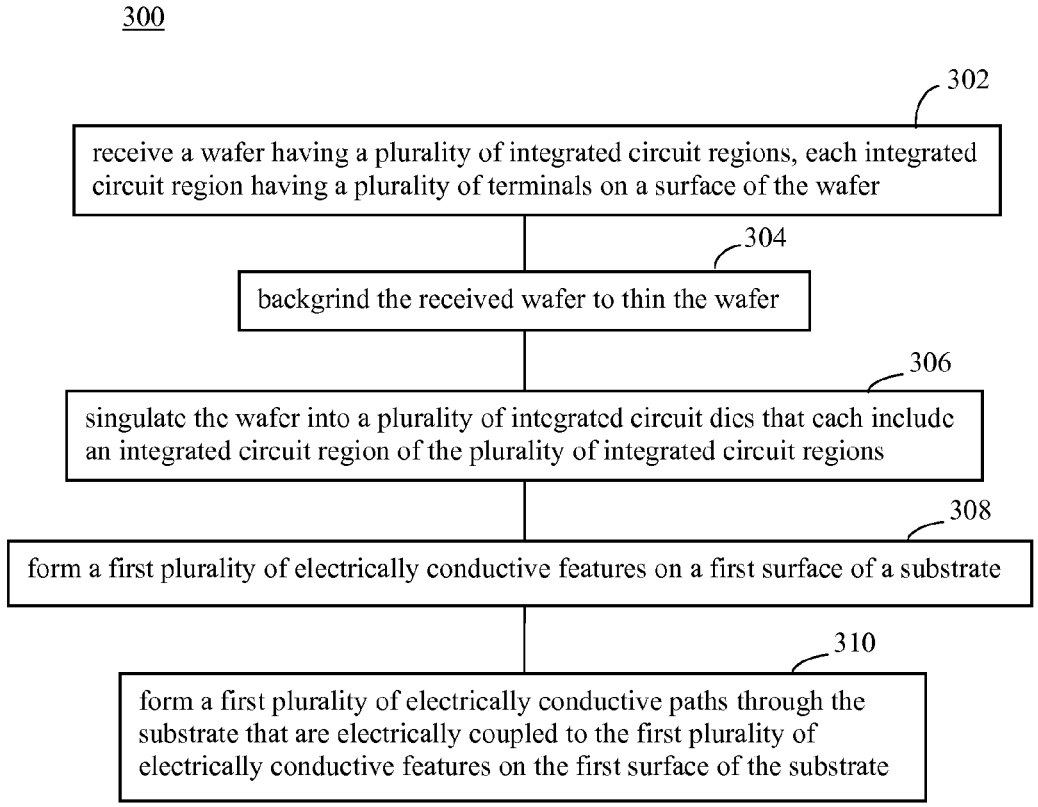
FIG. 3 shows a flowchart providing a portion of a process for forming integrated circuit packages, according to an embodiment of the present invention.

FIG. 3 shows a flowchart 300, which is a portion of a process for forming integrated circuit packages, according to an embodiment of the present invention. The steps of flowchart 300 do not necessarily need to be performed in the order shown. All steps of flowchart 300 do not need to be performed in all embodiments. Flowchart 300 is described below with reference to FIGS. 4-10, for illustrative purposes. Other structural and operational embodiments will be apparent to persons skilled in the relevant art(s) based on the discussion provided herein.

Figure 4:
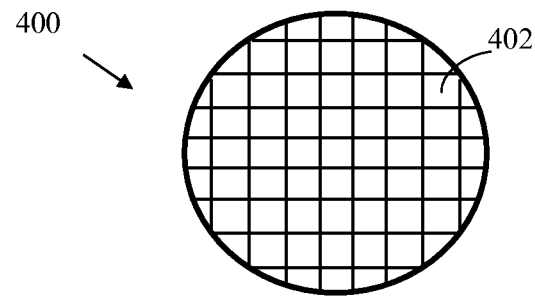
FIG. 4 shows a top view of an example wafer.

Flowchart 300 begins with step 302. In step 302, a wafer is received having a plurality of integrated circuit regions, each integrated circuit region having a plurality of terminals on a surface of the wafer. For example, FIG. 4 shows a plan view of a wafer 400. Wafer 400 may be silicon, gallium arsenide, or other wafer type. As shown in FIG. 4, wafer 400 has a surface defined by a plurality of integrated circuit regions 402 (shown as small rectangles in FIG. 4). Each integrated circuit region 402 is configured to be packaged separately into a separate wafer-level integrated circuit package, such as a wafer-level ball grid array package. Any number of integrated circuit regions 402 may be included in wafer 400, including 10s, 100s, 1000s, and even larger numbers.

Figure 5:
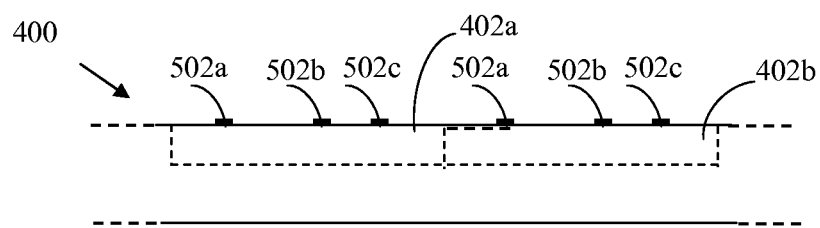
FIG. 5 shows a cross-sectional view of the wafer of FIG. 4, showing example first and second integrated circuit regions.

FIG. 5 shows a cross-sectional view of wafer 400, showing example first and second integrated circuit regions 402a and 202b. As shown in FIG. 5, integrated circuit regions 402a and 402b each include a plurality of terminals 502 (e.g., terminals 502a-502c). Terminals 502 are access points for electrical signals (e.g., input-output signals, power signals, ground signals, test signals, etc.) of integrated circuit regions 402. Any number of terminals 502 may be present on the surface of wafer 400 for each integrated circuit region 402, including 10s, 100s, and even larger numbers of terminals 502.

Figure 6:
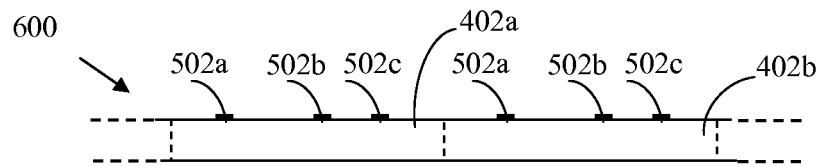
FIG. 6 shows a cross-sectional view of the wafer of FIG. 5 after having been thinned, according to an example embodiment of the present invention.

In step 304, the received wafer is thinned by backgrinding. Step 304 is optional. For instance, a backgrinding process may be performed on wafer 400 to reduce a thickness of wafer 400 to a desired amount, if desired and/or necessary. However, thinning of wafer 400 does not necessarily need to be performed in all embodiments. Wafer 400 may be thinned in any manner, as would be known to persons skilled in the relevant art(s) (e.g., a backgrinding process). For instance, FIG. 6 shows a cross-sectional view of wafer 400 after having been thinned according to step 304, resulting in a thinned wafer 600. According to step 304, wafer 400 is made as thin as possible to aid in minimizing a thickness of resulting packages that will include integrated circuit regions 402.

Figure 7:
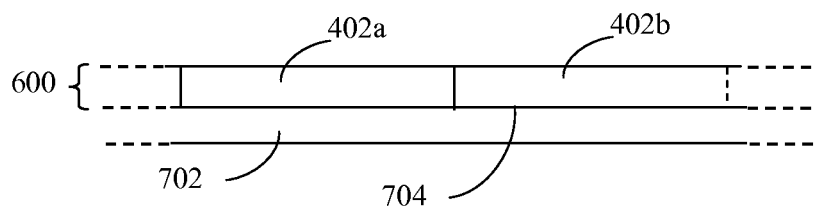
FIG. 7 shows a cross-sectional view of an adhesive material applied to a thinned wafer, according to an example embodiment of the present invention.

In an embodiment, flowchart 300 may optionally include the step of applying an adhesive material to a non-active surface of the wafer. For example, FIG. 7 shows a cross-sectional view of thinned wafer 600, with an adhesive material 702 applied to a non-active surface 704 of thinned wafer 600. Any suitable type of adhesive material may be used for adhesive material 702, including an epoxy, a conventional die-attach material, adhesive film, etc. This step is not necessarily performed in all embodiments, as further described below.

In step 306, the wafer is singulated into a plurality of integrated circuit dies that each includes an integrated circuit region of the plurality of integrated circuit regions.

Figure 8:
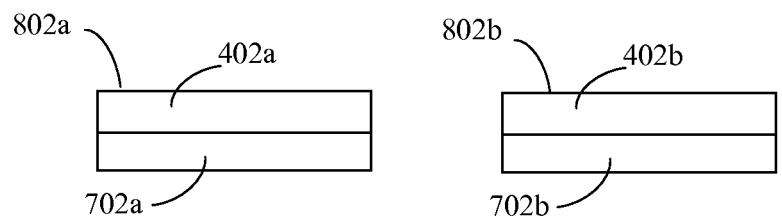
FIG. 8 shows a cross-sectional view of integrated circuit regions having been singulated into separate dies, according to an example embodiment of the present invention.

Wafer 400 may be singulated/diced in any appropriate manner to physically separate the integrated circuit regions from each other, as would be known to persons skilled in the relevant art(s). For example wafer 400 may be singulated by a saw, router, laser, etc., in a conventional or other fashion. FIG. 8 shows a cross-sectional view of integrated circuit regions 402a and 402b having been singulated from each other (also including adhesive material 702a and 702b, respectively) into dies 802a and 802b, respectively. Singulation of wafer 400 may result in 10s, 100s, 1000s, or even larger numbers of dies 802, depending on a number of integrated circuit regions 402 of wafer 400.

B. Example Dummy Substrate Processing Embodiments

Figure 9:
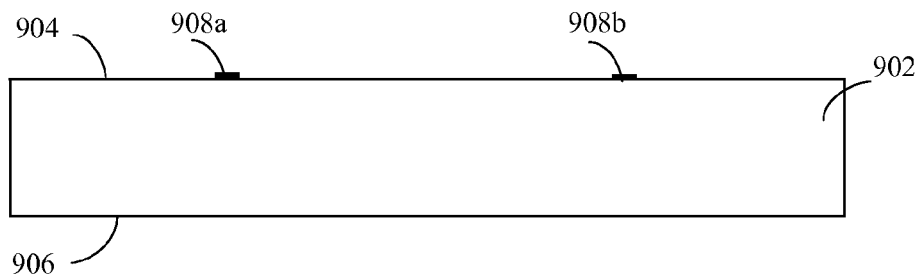
FIG. 9 shows a cross-sectional view of a substrate, according to an example embodiment of the present invention.

In step 308 of flowchart 300, a plurality of electrically conductive features is formed on a first surface of a substrate. For example, FIG. 9 shows a cross-sectional view of a substrate 902, according to an example embodiment. Substrate 902 may be referred to as a "dummy" substrate. As shown in FIG. 9, substrate 902 has opposing first and second surfaces 904 and 906. Furthermore, first and second electrically conductive features 908a and 908b are formed on first surface 904. Any number of electrically conductive features 908 may be formed on substrate 902. Electrically conductive features 908 may be formed of any suitable electrically conductive material, including a metal such as a solder or solder alloy, copper, aluminum, gold, silver, nickel, tin, titanium, a combination of metals/alloy, etc. Electrically conductive features 908 may be formed in any manner, including sputtering, plating, lithographic processes, etc., as would be known to persons skilled in the relevant art(s). Electrically conductive features 908 may be formed in any shape, including as traces/routing, as via capture pads (e.g., circular), etc.

Figure 10:
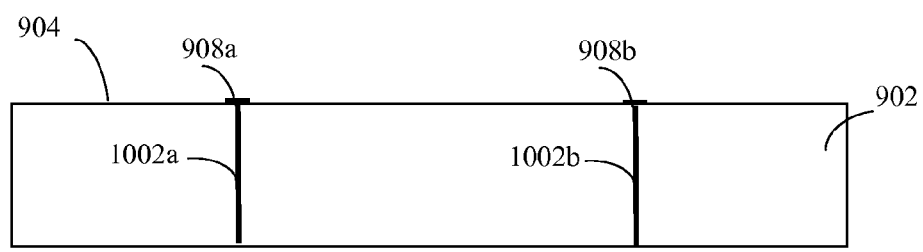
FIG. 10 shows a cross-sectional view of the substrate of FIG. 9, with first and second electrically conductive paths formed there through, according to an example embodiment.

In step 310, a plurality of electrically conductive paths is formed through the substrate that are electrically coupled to the first plurality of electrically conductive features on the first surface of the substrate. For example, FIG. 10 shows a cross-sectional view of substrate 902 of FIG. 9, with first and second electrically conductive paths 1002a and 1002b formed through substrate 902. As shown in FIG. 10, electrically conductive path 1002a is coupled to electrically conductive feature 908a at first surface 904 of substrate 902, and electrically conductive path 1002b is coupled to electrically conductive feature 908b at first surface 904 of substrate 902. Any number of electrically conductive paths 1002 may be formed through substrate 902, corresponding to electrically conductive features 908.

Electrically conductive paths 1002 may be formed in any manner, including being formed as electrically conductive vias through substrate 902. For example, openings may be formed through substrate 902 from first surface 904 to second surface 906 (e.g., by drilling, etching, etc.) that are subsequently filled and/or plated with an electrically conductive material, such as a metal including a solder or solder alloy, copper, aluminum, gold, silver, nickel, tin, titanium, a combination of metals/alloy, etc. The openings may be formed in any manner, including by drilling (e.g., mechanical drilling, laser drilling, etc.), by an etching process (e.g., reactive ion etching (RIE)), by a developing process (e.g., where substrate 902 is a polymer), etc. Electrically conductive paths 1002 may be filled and/or plated with the electrically conductive material at the same time that electrically conductive features 908 are formed (step 308), or may be filled and/or plated separately.

C. Example Die Mounting, Electrically Conductive Path, and Redistribution Interconnect Forming Embodiments Additional steps may be performed for flowchart 300 to further form integrated circuits in various configurations. For example, FIGS. 11-19 are described as follows with respect to a first embodiment for forming integrated circuit packages, while FIGS. 20-28 are described in a subsequent subsection with respect to another embodiment for forming integrated circuit packages.

For example, FIG. 11 shows a flowchart 1100 providing additional steps for flowchart 300 to form integrated circuit packages, according to an embodiment of the present invention. The steps of flowchart 1100 do not necessarily need to be performed in the order shown. All steps of flowchart 1100 do not need to be performed in all embodiments. Flowchart 1100 is described below with reference to FIGS. 12-19, for illustrative purposes. Other structural and operational embodiments will be apparent to persons skilled in the relevant art(s) based on the discussion provided herein.

In step 1102, a non-active surface of each of the plurality of dies is attached to the first surface of the substrate such that the dies are spaced apart on the substrate in a predetermined arrangement. For example, FIG. 12 shows a cross-sectional view of dies 802a and 802b attached to first surface 904 of substrate 902. As shown in FIG. 12, the non-active surface (i.e., surface 704 shown in FIG. 7) of each of dies 802a and 802b is attached to first surface 704 of substrate 902 by adhesive material 702a and 702b. For example, dies 802a and 802b may be positioned on substrate 902 in any manner, including through the use of a pick-and-place apparatus. After positioning of dies 802a and 802b, adhesive material 702a and 702b may be cured to cause dies 802a and 802b to become attached to substrate 902. Note that in embodiments, adhesive material 702 may be applied to first surface 904 of substrate 902 alternatively to, or in addition to applying adhesive material 702 on wafer 400/dies 802, as described above.

Substrate 902 can be any type of substrate material, including a dielectric material, a ceramic, a polymer, a semiconductor material, etc. For example, in an embodiment, substrate 902 may be a wafer of a same material as wafer 400. For instance, wafer 400 and substrate 902 may both be silicon wafers. By having wafer 400 (and thus dies 802) and substrate 902 be the same material, dies 802 and substrate 902 will react similarly during subsequent processing and operation, and thus will be more likely to adhere to each other more securely. For example, during temperature changes, same material dies 802 and substrate 902 will react similarly, such as by expanding or contracting uniformly, and thus will be less likely to detach from each other and less likely deviate from their placed positions to cause registration issues with subsequent lithography steps.

Figure 13A:
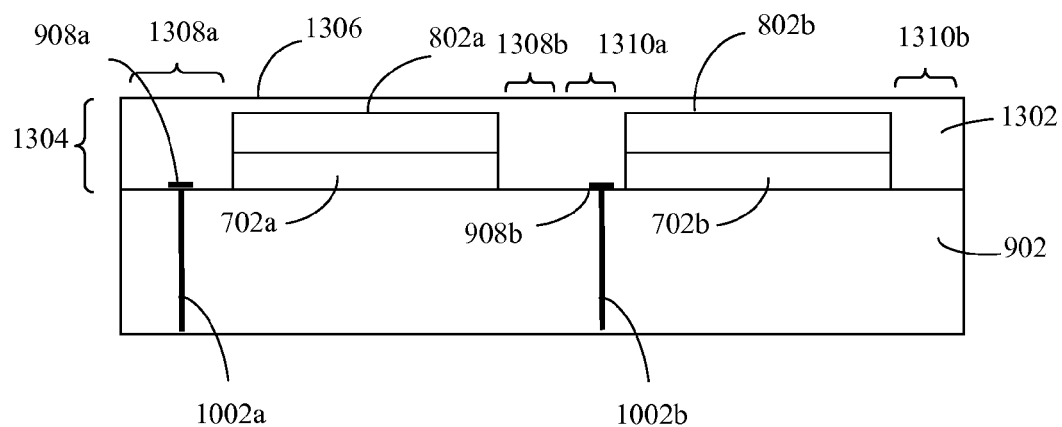
FIG. 13A shows a cross-sectional view of a layer of an insulating material applied to the substrate to cover dies, according to an example embodiment.

In step 1104, a substantially planar layer of an insulating material is formed on the first surface of the substrate to cover the dies on the substrate and to fill a space adjacent to each die on the substrate. For instance, FIG. 13A shows a cross-sectional view of a layer 1304 of an insulating material 1302 applied to substrate 902 to cover dies 802a and 802b. Insulating material 1302 may be applied in any manner, conventional or otherwise, as would be known to persons skilled in the relevant art(s). For example, insulating material 1302 may be applied according to a spin on or dry film process, and subsequently cured/dried, similar to a corresponding wafer-level process. Insulating material 1302 is applied such that layer 1304 has a thickness greater than a thickness of dies 802 (and adhesive material 702). Layer 1304 may be formed or processed (e.g., polished) such that a first surface 1306 of layer 1304 is substantially planar. Insulating material 1302 may be an electrically insulating material, such as a polymer, a dielectric material such as a photo-imagable dielectric, and/or other electrically non-conductive material.

As shown in FIG. 13A, insulating material 1302 covers dies 802a and 802b. Furthermore, as shown in FIG. 13A, insulating material 1302 fills spaces 1308a and 1308b adjacent to die 802a on substrate 902, and fills spaces 1310a and 1310b adjacent to die 802b on substrate 902. Insulating material 1302 may fill spaces on any number of sides (edges of dies 802 perpendicular to their active surfaces) of dies 802, including all four sides, in embodiments.

Figure 13B:
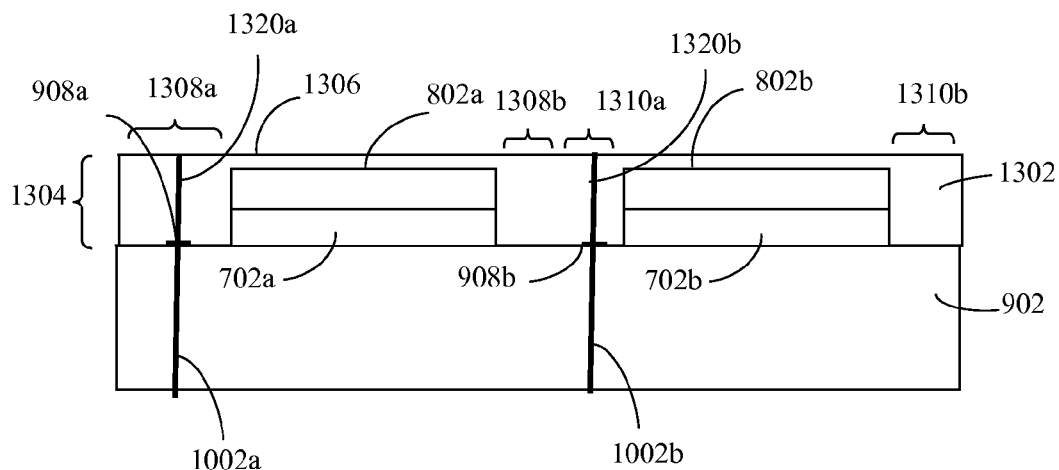
FIG. 13B shows a cross-sectional view of the insulating material on the substrate of FIG. 13A, with first and second electrically conductive paths formed through the insulating material, according to an example embodiment.

In step 1106, a second plurality of electrically conductive paths is formed through the insulating material. For example, FIG. 13B shows a cross-sectional view of insulating material 1302 on substrate 902, as in FIG. 13A, with first and second electrically conductive paths 1320a and 1320b formed through insulating material 1302. As shown in FIG. 13B, a first end of electrically conductive path 1320a is coupled to electrically conductive feature 908a, and a first end of electrically conductive path 1320b is coupled to electrically conductive feature 908b. In an embodiment, electrically conductive paths 1002a and 1320a may be formed to be coaxially aligned. Alternatively, in another embodiment, electrically conductive paths 1002a and 1320a may not be coaxially aligned, but electrically conductive feature 908a may be elongated (e.g., may include a trace or other routing) on substrate 902 to electrically connect the first ends of electrically conductive paths 1002a and 1320a.

Second ends of electrically conductive paths 1320a and 1320b are exposed at a surface of insulating material 1302. First electrically conductive path 1320a is formed through insulating material 1302 in space 1308a adjacent to die 802a, and second electrically conductive path 1320b is formed through insulating material 1302 in space 1310a adjacent to die 802b. Electrically conductive paths 1320 may be formed through insulating material 1302 in any manner, including in the manner described above for electrically conductive paths 1002. For example, openings may be formed through insulating material 1302 in any manner, including by drilling (e.g., mechanical drilling, laser drilling, etc.), by an etching process, by a developing process (e.g., where insulating material 1302 is a polymer), etc. The openings may subsequently be plated and/or filled with an electrically conductive material to form electrically conductive paths 1320.

Figure 16:
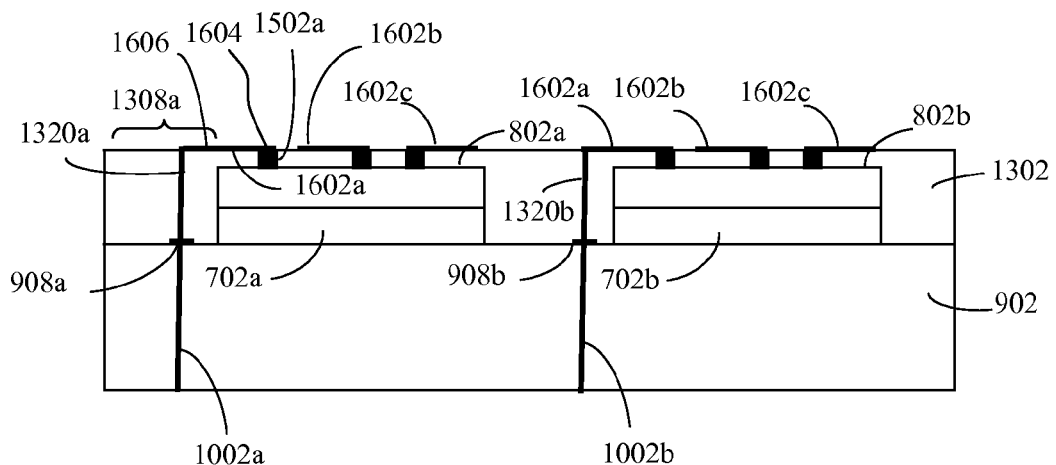

In step 1108, at least one redistribution interconnect is formed on the insulating material for each die to have a first portion coupled to a terminal of the die and a second portion that extends away from the first portion over a portion of the space adjacent to the die, the second portion being coupled to an electrically conductive path of the second plurality of electrically conductive paths. For example, FIG. 16 shows redistribution interconnects 1602a-1602c, also known as "redistribution layers (RDLs)," formed on insulating material 1302 for each of dies 802a and 802b. With reference to redistribution interconnect 1602a, for example, redistribution interconnect 1602a has a first portion 1604 and a second portion 1606. First portion 1604 is coupled to a terminal of die 802a. Second portion 1606 extends away from first portion 1604 (e.g., laterally) over insulating material 1302, over a portion of space 1308a adjacent to die 802a. As shown in FIG. 16, second portion 1606 of redistribution interconnect 1602a at die 802a is connected to electrically conductive path 1320a, and second portion 1606 of redistribution interconnect 1602a at die 802b is connected to electrically conductive path 1320b. Note that not all redistribution interconnects 1602 necessarily extend over a space adjacent to a die 802. For example, redistribution interconnects 1602b and 1602c coupled to terminals of die 802a do not extend over a space adjacent to die 802a.

Figure 14:
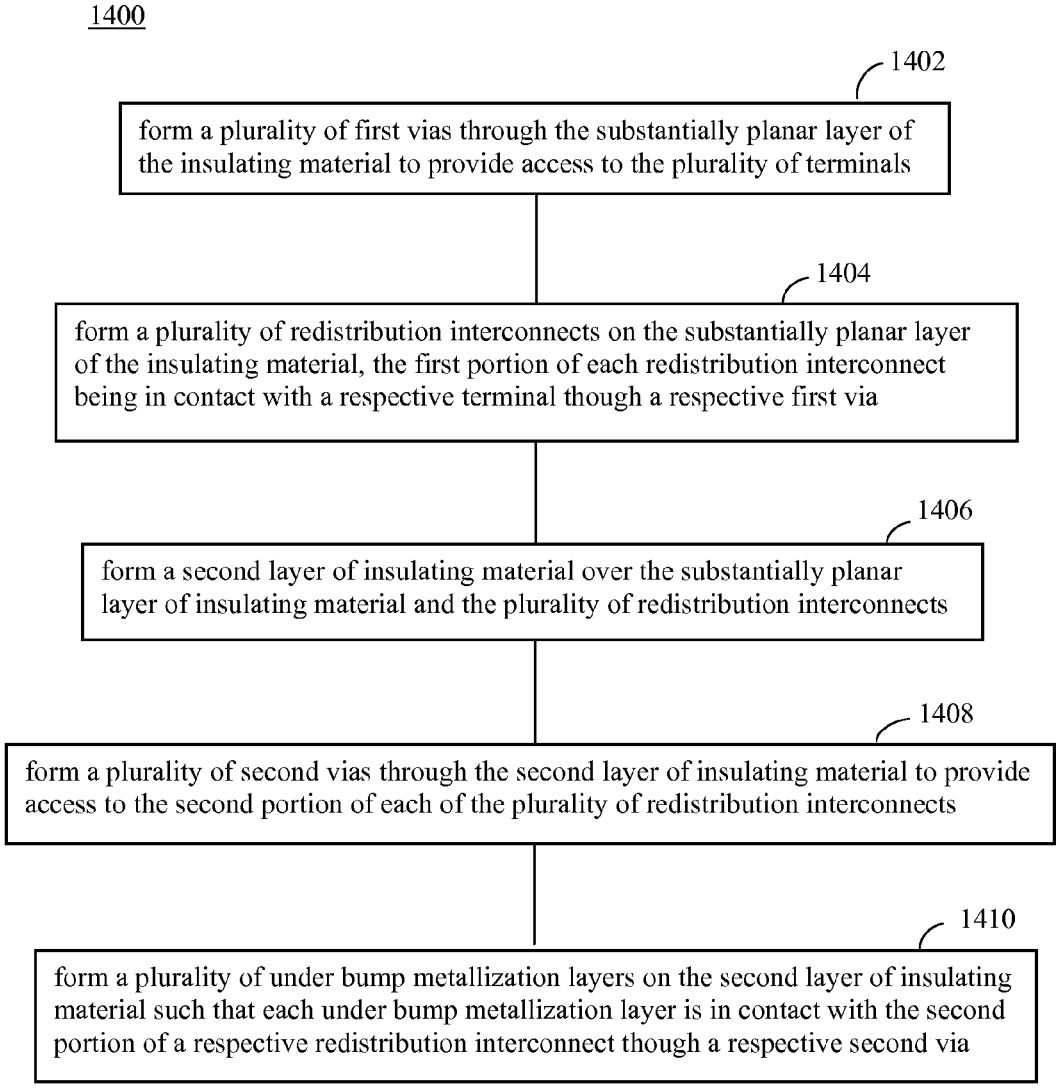
FIG. 14 shows a flowchart providing example steps for forming redistribution interconnects, according to an embodiment of the present invention.

Redistribution interconnects 1602 may be formed in step 1106 in any manner, including being formed according to processes used in standard wafer-level packaging fabrication processes. For instance, FIG. 14 shows a flowchart 1400 providing example steps for forming redistribution interconnects 1602, according to an embodiment of the present invention. Not all steps of flowchart 1400 need to be performed in all embodiments, and that redistribution interconnects 1602 may be formed according to processes other than flowchart 1400. Flowchart 1400 is described below with respect to FIGS. 15-19, for illustrative purposes.

Figure 15:
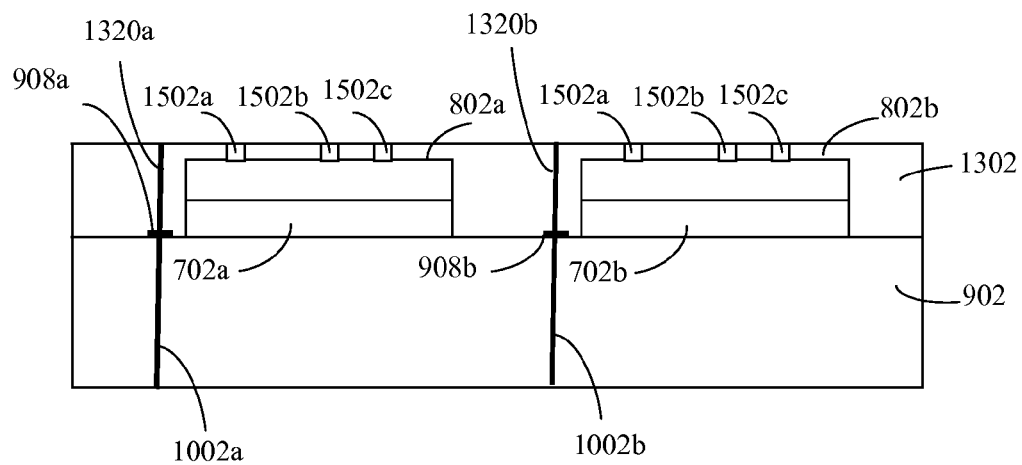
FIGS. 15-19 show views of the substrate of FIG. 13B at various points during a process for forming redistribution interconnects, according to example embodiments.

Flowchart 1400 begins with step 1402. In step 1402, a plurality of first vias is formed through the substantially planar layer of the insulating material to provide access to the plurality of terminals. For example, FIG. 15 shows a cross-sectional view of substrate 902, with dies 802a and 802b covered on substrate 902 with insulating material 1302. As further shown in FIG. 15, a plurality of vias 1502a-1502c are formed through insulating material 1302 for both of dies 802a and 802b. Each via 1502 provides access to a respective terminal (e.g., one of terminals 302 shown in FIG. 3). Any number of vias 1502 may be present, depending on a number of terminals present. Note that vias 1502 may have straight vertical walls (e.g., vias 1502 may have a cylindrical shape) as shown in FIG. 10, may have sloped/tapered walls, or may have other shapes. Vias 1502 may be formed in any manner, including by etching, drilling, developing, etc., as would be known to persons skilled in the relevant art(s).

In step 1404, a plurality of redistribution interconnects is formed on the substantially planar layer of the insulating material, the first portion of each redistribution interconnect being in contact with a respective terminal though a respective first via. For example, as shown in FIG. 16, and as described above, routing interconnects 1602a-1602c are formed on insulating material 1302 for each of dies 802a and 802b. As described above, routing interconnect 1602a has a first portion 1604 and a second portion 1606. First portion 1604 of routing interconnect 1602a is in contact with a terminal of die 802a through via 1502a (formed in step 1402), and second portion 1606 of routing interconnect 1602a extends (e.g., laterally) over insulating material 1302 to be coupled with electrically conductive path 1320a. In this manner, a plurality of redistribution layers 1602 are formed for dies 802a and 802b, at least some of which extend over the space adjacent to dies 802.

Note that second portions 1606 of routing interconnects 1602 can have various shapes. For example, second portions 1606 may be rectangular shaped, may have a rounded shape, or may have other shapes. In an embodiment, first portion 1604 of routing interconnects 1602 may be similar to a standard via pad plating, and second portion 1606 may extend from first portion 1604 in a similar fashion as a standard metal trace or routing formed on a substrate. Routing interconnects 1602 may be formed of any suitable electrically conductive material, including a metal such as a solder or solder alloy, copper, aluminum, gold, silver, nickel, tin, titanium, a combination of metals/alloy, etc. Routing interconnects 1602 may be formed in any manner, including sputtering, plating, lithographic processes, etc., as would be known to persons skilled in the relevant art(s).

Figure 17:
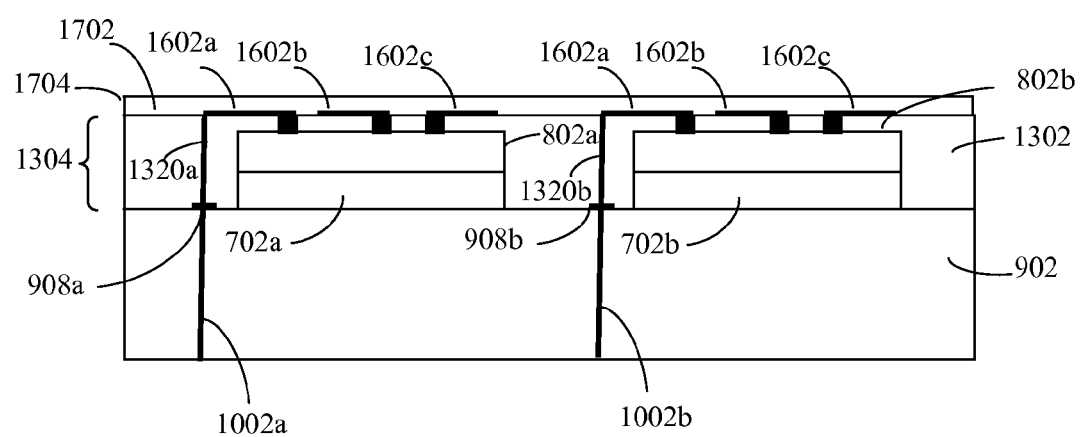

In step 1406, a second layer of insulating material is formed over the substantially planar layer of insulating material and the plurality of redistribution interconnects. For instance, FIG. 17 shows a cross-sectional view of a second layer 1704 of an insulating material 1702 formed over first layer 1304 of insulating material 1302 and redistribution interconnects 1602. Second insulating material 1702 may be applied in any manner, conventional or otherwise, as would be known to persons skilled in the relevant art(s). For example, insulating material 1702 may be applied according to a spin on or dry film process, similar to a corresponding wafer-level process. Insulating material 1702 is applied such that layer 1704 electrically insulates a top surface of redistribution interconnects 1602. Layer 1704 may be formed or processed (e.g., polished) to be substantially planar. Insulating material 1702 may be the same material or a different material from insulating material 1302. For example, insulating material 1702 may be an electrically insulating material, such as a polymer, a dielectric material such as a photo-imagable dielectric, and/or other electrically non-conductive material.

Figure 18:
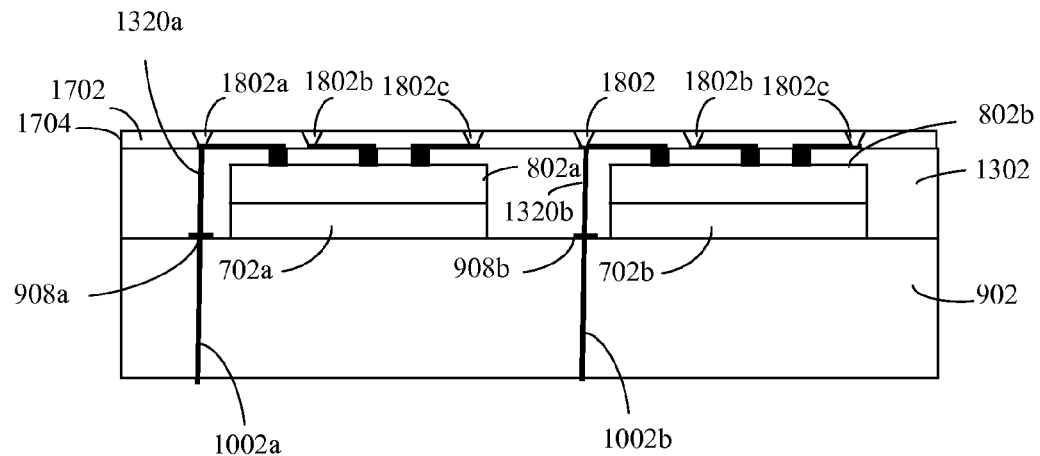

In step 1408, a plurality of second vias is formed through the second layer of insulating material to provide access to the second portion of each of the plurality of redistribution interconnects. For example, FIG. 18 shows a cross-sectional view of second vias 1802a-1802c formed through second insulating material 1702 for each of dies 802a and 802b to provide access to second portions 1606 of redistribution interconnects 1602a-1602c, respectively. Each second via 1802 provides access to a respective redistribution interconnect 1602. Any number of second vias 1802 may be present, depending on a number of redistribution interconnects present. Note that second vias 1802 may have sloped walls as shown in FIG. 18, may have straight vertical walls (e.g., vias 1802 may have a cylindrical shape), or may have other shapes. Second vias 1802 may be formed in any manner, including by etching, drilling, etc., as would be known to persons skilled in the relevant art(s).

Figure 19:
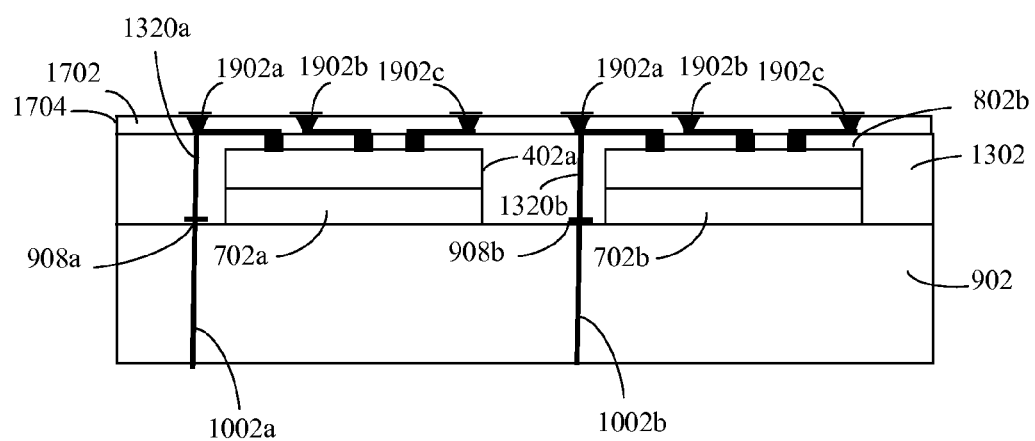

In step 1410, a plurality of under bump metallization layers is formed on the second layer of insulating material such that each under bump metallization layer is in contact with the second portion of a respective redistribution interconnect though a respective second via. For example, FIG. 19 shows a cross-sectional view of under bump metallization layers 1902a-1902c formed in contact with second portions 1606 of respective redistribution interconnects 1602 through respective second vias 1802. Under bump metallization (UBM) layers 1902 are typically one or more metal layers formed (e.g., by metal deposition—plating, sputtering, etc.) to provide a robust interface between redistribution interconnects 1602 and a package interconnect mechanism (such as a ball interconnect). A UBM layer serves as a solderable layer for a solder package interconnect mechanism. Furthermore, a UBM provides protection for underlying metal or circuitry from chemical/thermal/electrical interactions between the various metals/alloys used for the package interconnect mechanism. In an embodiment, UBM layers 1902 are formed similarly to standard via plating.

Note that steps of flowchart 1400 may be repeated any number of times, to create further layers of redistribution interconnects. For example, FIG. 17 shows layer 1704 formed over a first layer of redistribution interconnects 1602. Steps 1404 and 1406 may be repeated, to form a second layer of redistribution interconnects 1602 on first layer 1704 in FIG. 17, and to form a next layer of insulating material 1702, similar to layer 1704, on the second layer of redistribution interconnects 1602. Steps 1404 and 1406 may be repeated any number of times, to form a stack of alternating layers of redistribution interconnects 1602 and insulating material 1702 of any suitable height. After steps 1404 and 14506 are repeated as desired, step 1408 may be performed to form second vias 1802 through the multiple layers of insulating material 1702 to provide access to second portions 1606 of the redistribution interconnects 1602 of each formed layer of redistribution interconnects 1602. Step 1410 may be performed to form under bump metallization layers 1902 in second vias 1802 that are in contact with redistribution interconnects 1602 at each formed layer of redistribution interconnects 1602.

D. Example Die Mounting (in Openings) and Electrically Conductive Path Forming Embodiments In another embodiment, FIG. 20 shows a flowchart 2000 providing additional steps for flowchart 300 to form integrated circuit packages, according to an embodiment of the present invention. For example, flowchart 2000 may be performed alternatively to flowchart 1100 shown in FIG. 11. The steps of flowchart 2000 do not necessarily need to be performed in the order shown. All steps of flowchart 2000 do not need to be performed in all embodiments. Flowchart 2000 is described below with reference to FIGS. 21-28, for illustrative purposes. Other structural and operational embodiments will be apparent to persons skilled in the relevant art(s) based on the discussion provided herein.

Figure 21:
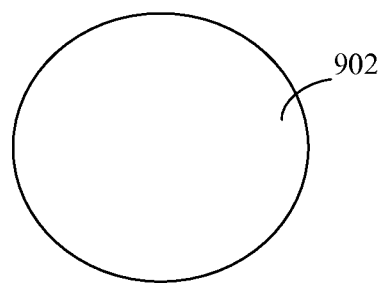
FIG. 21 shows a top view of the substrate of FIG. 10, according to an example embodiment.

In step 2002, a substantially planar layer of a thick film material is formed on a first surface of a substrate. FIG. 21 shows a top view of substrate 902 described above (FIG. 10) that may be processed in step 2002, according to an example embodiment of the present invention. As described above, substrate 902 can be any type of substrate material. Substrate 902 may be considered a "dummy" substrate, because substrate 902 may optionally be partially or entirely removed from dies 802 in a subsequent processing step, as described further below.

Figure 22:
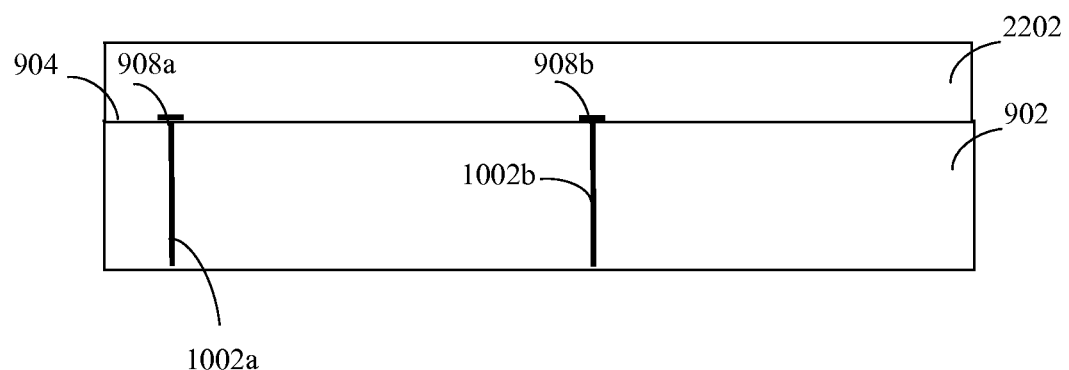
FIG. 22 shows a layer of a thick film material formed on a first surface of a substrate, according to an example embodiment.

FIG. 22 shows a layer of a thick film material 2202 formed on a first surface 904 of substrate 902. Thick film material 2202 may be applied in any manner, conventional or otherwise, as would be known to persons skilled in the relevant art(s). For example, thick film material 2202 may be applied according to a spin on or dry film process, and subsequently cured/dried, similar to a corresponding wafer-level process. Thick film material 2202 may have a thickness less than, equal to, or greater than a thickness of dies 802 (and adhesive material 702). For example, thick film material 2202 may have a thickness in the range of 50-200 µm. The thickness of thick film material 2202 can be controlled by modifying parameters of the process used to form thick film material 2202, and/or by forming multiple layers of thick film material 2202 on first surface 904 (e.g., to stack layers of thick film material 2202). Thick film material 2202 may be formed or processed (e.g., polished) such that a substantially planar surface for thick film material 2202 is formed on substrate 902. Thick film material 2202 may be an electrically insulating material, such as a polymer, a dielectric material such as a photo-imagable dielectric, a standard spin-on dielectric material, and/or other suitable thick film material. For example, thick film material 2202 may be SU-8 2000 or SU-8 3000, which are epoxy based photoresist materials supplied by MicroChem Corp. of Newton, Mass.

Figure 23:
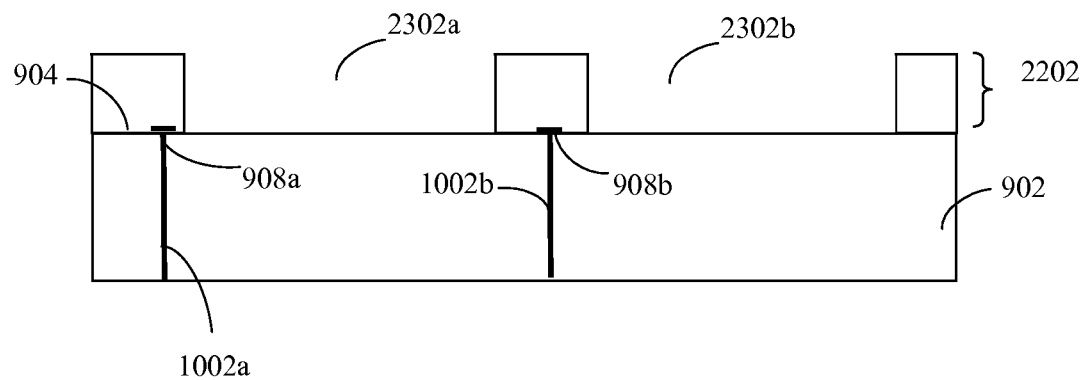
FIGS. 23 and 24 show views of the substrate and thick film material of FIG. 22, with a plurality of openings formed in the thick film material, according to example embodiments.
Figure 24:
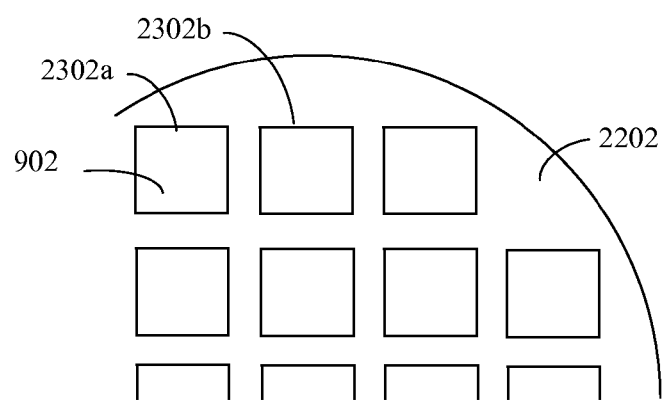

In step 2004, a plurality of openings is formed in the layer of the thick film material. For example, FIG. 23 shows a cross-sectional view of substrate 902 and thick film material 2202, with a plurality of openings 2302 formed in thick film material 2202, according to an example embodiment of the present invention. FIG. 24 shows a top view of a portion of substrate 902, with openings 2302 formed in thick film material 2202 (in an embodiment where substrate 902 is a circular wafer). Openings 2302 may be formed/patterned in thick film material 2202 in any arrangement, including in an array of rows and columns of openings 2302, as shown in FIG. 24. Openings 2302 may have a depth of an entire thickness of thick film material 2202 (as shown in FIG. 22), or may have a depth that is less than an entire thickness of thick film material 2202. Openings 2302 may have any shape, including being round, rectangular (as shown in FIG. 23), other polygon, or irregular. Openings 2302 may be formed in thick film material 2202 in any suitable manner, including by etching (e.g., by laser etching, by a photolithographic process, by chemical etching, by mechanical etching, etc.), by developing, by drilling, or by other suitable process.

Figure 25:
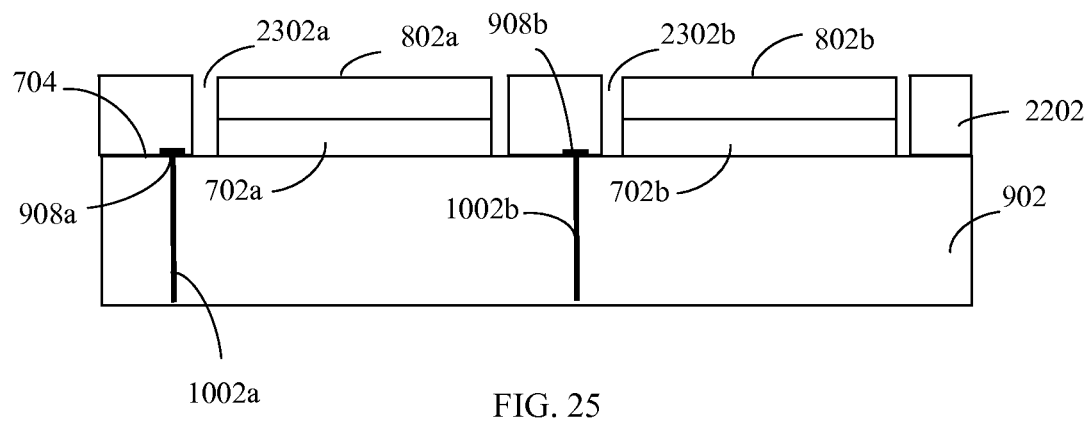
FIGS. 25 and 26 show views of dies attached to the first surface of the substrate of FIGS. 23 and 24 in respective openings, according to example embodiments.
Figure 26:
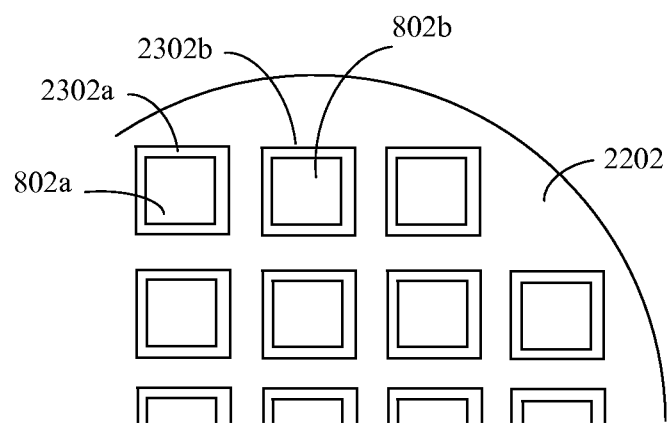

In step 2006, a non-active surface of each of the plurality of dies is attached to the first surface of the substrate in a corresponding opening of the plurality of openings. For example, FIG. 25 shows a cross-sectional view of dies 802a and 802b attached to first surface 904 of substrate 902 in respective openings 2302a and 2302b. FIG. 26 shows a top view of the portion of substrate 902 shown in FIG. 25, with dies 802 positioned in openings 2302. As shown in FIG. 25, the non-active surface (i.e., surface 704 shown in FIG. 7) of each of dies 802a and 802b is attached to first surface 904 of substrate 902 by adhesive material 702a and 702b. For example, dies 802a and 802b may be positioned on substrate 902 in openings 2302a and 2302b, respectively, in any manner, including through the use of a pick-and-place apparatus, a self-aligning process, or other technique. After positioning of dies 802a and 802b, adhesive material 702a and 702b may be cured to cause dies 802a and 802b to become attached to substrate 902. Note that in embodiments, adhesive material 702 may be applied to first surface 704 of substrate 902 alternatively to, or in addition to applying adhesive material 702 on wafer 400/dies 802, as described above.

Figure 27A:
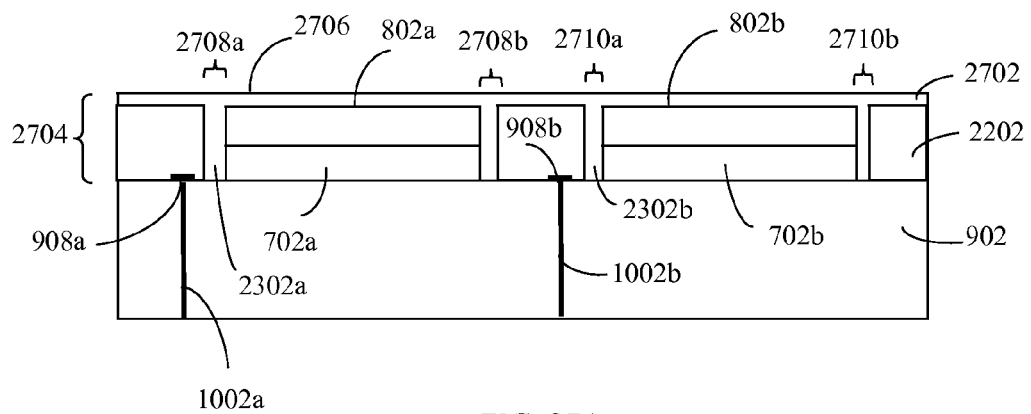
FIG. 27A shows a cross-sectional view of a layer of an insulating material applied to the substrate of FIGS. 25 and 26 to cover dies and the thick film material, according to an example embodiment.

In step 2008, a substantially planar layer of an insulating material is formed over the first surface of the substrate to cover the dies in the openings on the substrate. For instance, FIG. 27A shows a cross-sectional view of a layer 2704 of an insulating material 2702 applied to substrate 902 to cover dies 802a and 802b and thick film material 2202. Insulating material 2702 may be applied in any manner, conventional or otherwise, as would be known to persons skilled in the relevant art(s). For example, insulating material 2702 may be applied according to a spin on or dry film process, and subsequently cured/dried, similar to a corresponding wafer-level process. Insulating material 2702 is applied such that layer 2704 has a thickness greater than a thickness of dies 802 (and adhesive material 702). Layer 2704 may be formed or processed (e.g., polished) such that a first surface 2706 of layer 2704 is substantially planar. Insulating material 2702 may be an electrically insulating material, such as a polymer, a dielectric material such as a photo-imagable dielectric, and/or other electrically non-conductive material.

As shown in FIG. 27A, insulating material 2702 covers dies 802a and 802b. Furthermore, as shown in FIG. 27A, insulating material 2702 fills spaces 2708a and 2708b in opening 2302a adjacent to die 802a on substrate 902, and fills spaces 2710a and 2710b in opening 2302b adjacent to die 802b on substrate 902. Insulating material 2702 may fill spaces on any number of sides (edges of dies 802 perpendicular to their active surfaces) of dies 802, including all four sides, in embodiments. Spaces 2708 and 2710 may have any width. In some embodiments, an opening 2302 may have a size approximately the same as a die 802 residing therein, and thus spaces 2708 and 2710 may be very narrow or non-existent on one or more sides of die 802. Note that in an embodiment, because dies 802 are located in respective openings 2302 of thick film material 2202, dies 802 are held relatively stationary during application of insulating material 2702 (as compared to applying insulating material 2702 over dies 802 when thick film material 2202 is not present).

Figure 27B:
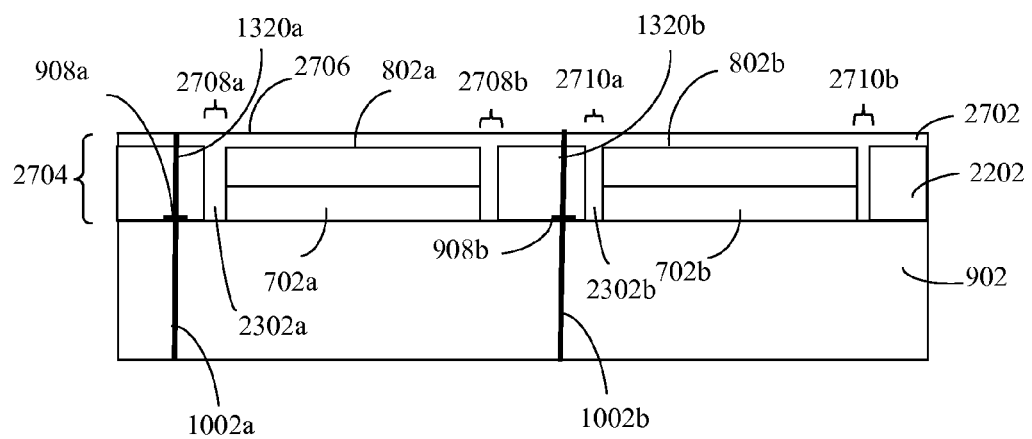
FIG. 27B shows a cross-sectional view of the insulating material on the substrate, as in FIG. 27A, with first and second electrically conductive paths formed through the insulating material and thick film material, according to an example embodiment.

In step 2010, a second plurality of electrically conductive paths is formed through the insulating material. For example, FIG. 27B shows a cross-sectional view of insulating material 2702 on substrate 902, as in FIG. 27A, with first and second electrically conductive paths 1320a and 1320b formed through insulating material 2702 and thick film material 2202. As shown in FIG. 27B, a first end of electrically conductive path 1320a is coupled to electrically conductive feature 908a, and a first end of electrically conductive path 1320b is coupled to electrically conductive feature 908b. Second ends of electrically conductive paths 1320a and 1320b are exposed at a surface of insulating material 2702. First electrically conductive path 1320a is formed adjacent to die 802a, and second electrically conductive path 1320b is formed adjacent to die 802b. Electrically conductive paths 1320 may be formed through insulating material 2702 and thick film material 2202 in any manner, including in the manner described above for electrically conductive paths 1002. For example, openings may be formed through insulating material 2702 and thick film material 2202 in any manner, including by drilling (e.g., mechanical drilling, laser drilling, etc.), by an etching process, by a developing process (e.g., where insulating material 2702 and thick film material 2202 are polymers), etc. The openings may subsequently be plated and/or filled with an electrically conductive material to form electrically conductive paths 1320. Furthermore, as described above, electrically conductive paths 1002 and 1320 may be formed to be coaxially aligned or to not be coaxially aligned.

Figure 28:
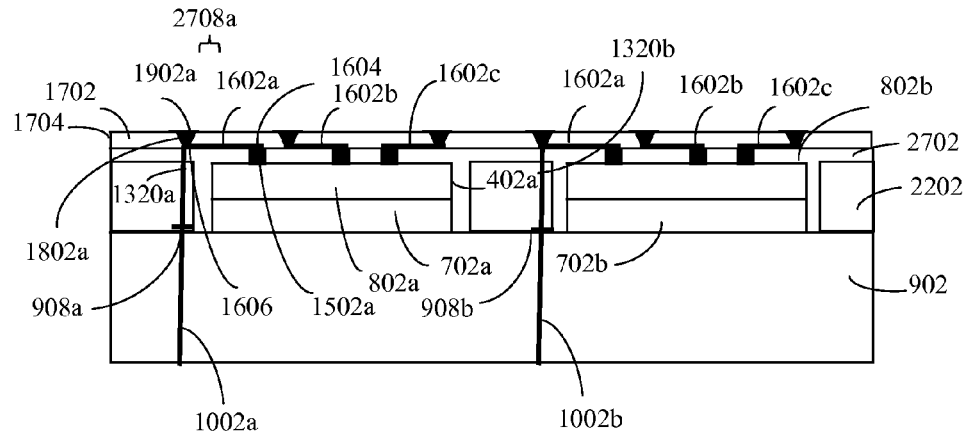
FIG. 28 shows redistribution interconnects formed on the insulating material for each die of FIG. 27B, according to an example embodiment.

In step 2012, at least one redistribution interconnect is formed on the insulating material for each die to have a first portion coupled to a terminal of a respective die and a second portion that extends away from the first portion over a portion of the insulating material, the second portion being coupled to an electrically conductive path of the second plurality of electrically conductive paths. For instance, redistribution interconnects may be formed on insulating material 2702 for each of dies 802a and 802b shown in FIG. 27B. The redistribution interconnects may be formed in any suitable manner, including according to flowchart 1400 shown in FIG. 14, and described above. For example, FIG. 28 shows redistribution interconnects 1602a-1602c formed on insulating material 2702 for each of dies 802a and 802b. With reference to redistribution interconnect 1602a of die 802a, for example, redistribution interconnect 1602a has a first portion 1604 and a second portion 1606. First portion 1604 is coupled to a terminal of die 802a through via 1502a. Second portion 1606 extends away from first portion 1604 (e.g., laterally) over insulating material 2702, over a portion of space 1608a adjacent to die 802a. As shown in FIG. 28, second portion 1606 of redistribution interconnect 1602a at die 802a is coupled to electrically conductive path 1320a, and second portion 1606 of redistribution interconnect 1602a at die 802b is coupled to electrically conductive path 1320b. An under bump metallization (UBM) layers 1902a is formed in contact with second portion 1606 of redistribution interconnects 1602a through a via 1802a. As shown in FIG. 28, second portion 1606 may extend over space 2708a (shown in FIG. 27A) adjacent to die 802a in opening 2302a, and may further extend (e.g., as routing) over thick film material 2202 (e.g., beyond the end of electrically conductive path 1320a). Note that not all redistribution interconnects 1602 necessarily extend over a space adjacent to a die 802.

E. Example Embodiments for Forming Package-on-Package Structures

Figure 29:
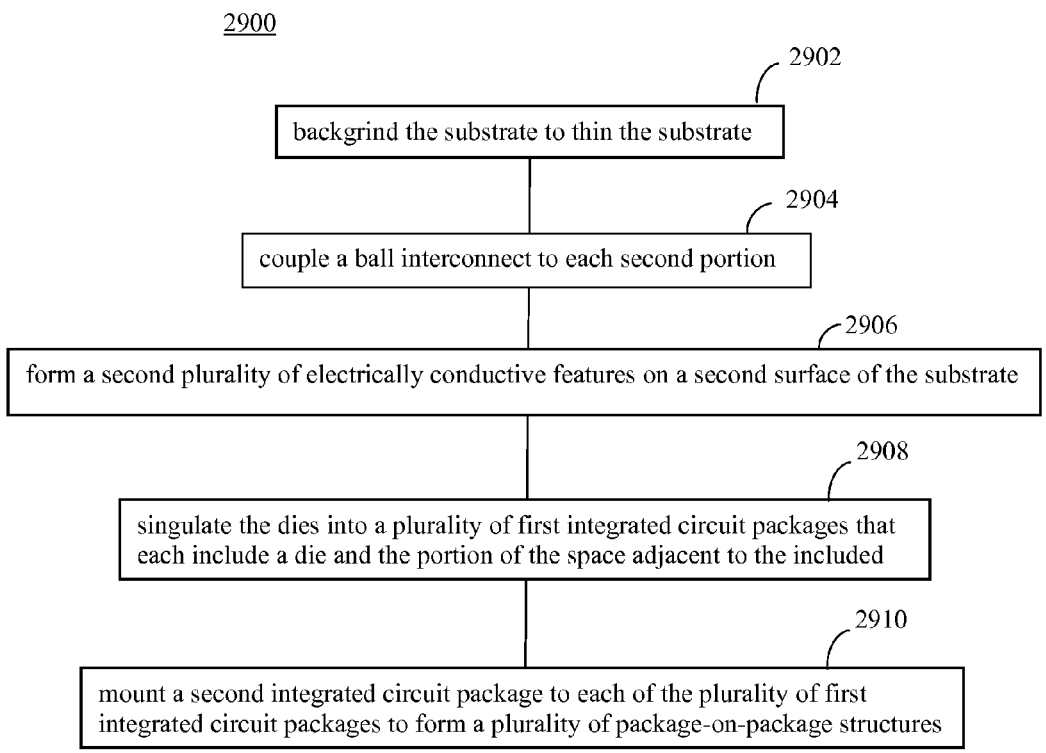
FIG. 29 shows a flowchart providing additional steps for a process to form integrated circuit packages, according to an embodiment of the present invention.

Note that additional steps may be performed for flowchart 300 (in addition to flowchart 1100 or flowchart 2000) to further form integrated circuits in various configurations. For example, FIG. 29 shows a flowchart 2900 providing additional steps for flowchart 300 to form integrated circuit packages, according to an embodiment of the present invention. The steps of flowchart 2900 do not necessarily need to be performed in the order shown. All steps of flowchart 2900 do not need to be performed in all embodiments. Flowchart 2900 may be performed with regard to the structures illustrated in FIGS. 19 and 28, for example. Flowchart 2900 is described below with reference to FIGS. 30-43, for illustrative purposes. Other structural and operational embodiments will be apparent to persons skilled in the relevant art(s) based on the discussion provided herein.

In step 2902, the substrate is thinned by backgrinding the substrate. Step 2902 is optional. A backgrinding process may be performed on substrate 902 to reduce a thickness of substrate 902 to a desired amount, if desired and/or necessary. Substrate 902 may be thinned in any manner, as would be known to persons skilled in the relevant art(s). For example, substrate 902 is made as thin as possible to aid in minimizing a thickness of resulting packages that are formed according to the embodiments described herein.

Figure 30:
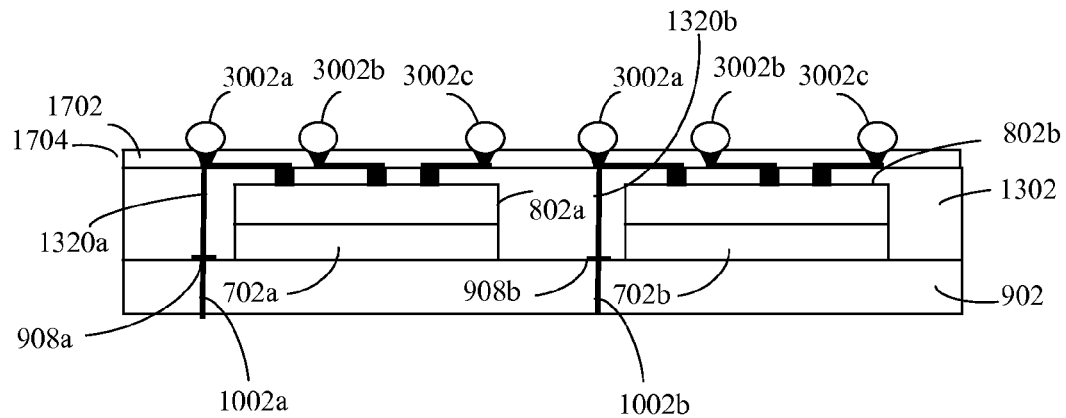
FIGS. 30 and 31 show views of the structure shown in FIG. 19, with ball interconnects formed on respective UBM layers, according to example embodiments.
Figure 31:
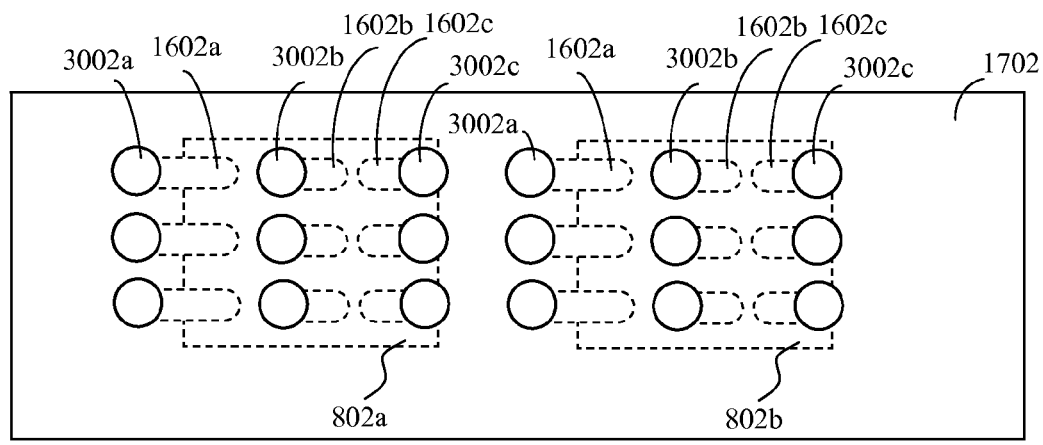

In step 2904, a ball interconnect is coupled to each second portion. For example, FIG. 30 shows a cross-sectional view of the structure shown in FIG. 19, with substrate 902 having been thinned (according to step 2902), and with ball interconnects 3002a-3002c formed on respective UBM layers 1902a-1902c for each of dies 802a and 802b. In this manner, a plurality of ball interconnects 3002 may be formed in electrical contact with respective routing interconnects 1602. For instance, FIG. 31 shows a view of a surface of insulating material 1702, where ball interconnects 3002 related to dies 802a and 802b (indicated by dotted lines) are visible, according to an example embodiment of the present invention. As shown in FIG. 31, each ball interconnect 3002 is coupled to a respective redistribution interconnect 1602 (shown as dotted lines). Furthermore, some ball interconnects 3002 are coupled to redistribution interconnects 1602 in a manner such that the ball interconnect 3002 is over insulating material 1702 outside of a periphery of the respective die 802, instead of in an area within the die periphery. In this manner, an effective area of dies 802 is increased for attachment of ball interconnects 3002.

Figure 32:
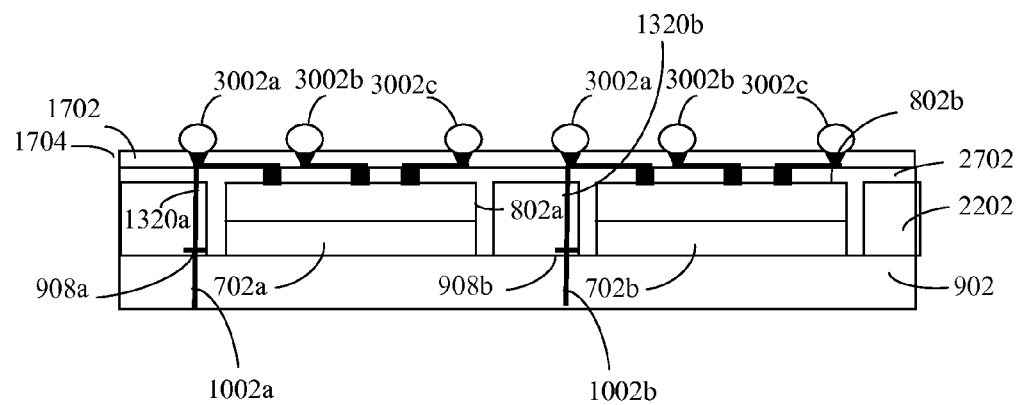
FIGS. 32 and 33 show views of the structure shown in FIG. 28, with ball interconnects formed on respective UBM layers, according to example embodiments.
Figure 33:
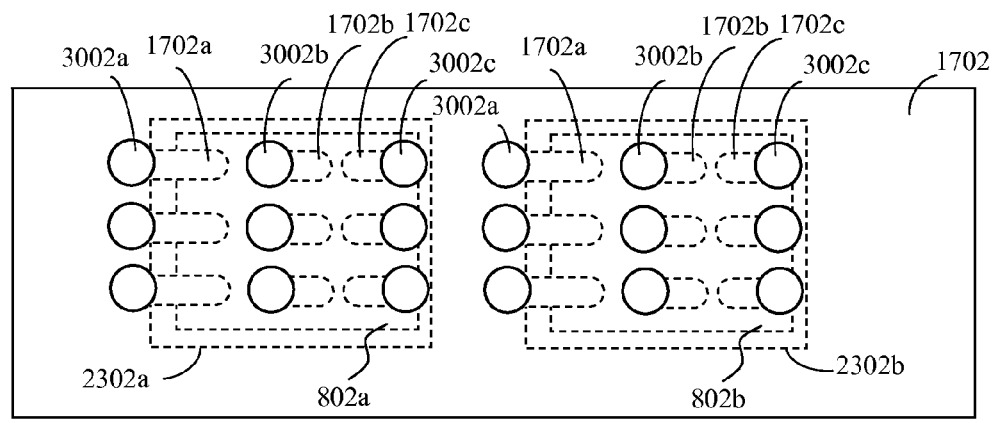

FIG. 32 shows a cross-sectional view of the structure shown in FIG. 28, with substrate 902 having been thinned (according to step 2902), and with ball interconnects 3002a-3002c formed on respective UBM layers 1902a-1902c for each of dies 802a and 802b in a similar fashion as shown in FIG. 30, according to an example embodiment of the present invention. FIG. 33 shows a view of a surface of insulating material 1702 of FIG. 32, where ball interconnects 3002 related to dies 802a and 802b (indicated by dotted lines) are visible. In FIG. 32, ball interconnect 3002c slightly overlaps insulating material 2702 (not indicated in FIG. 33) in cavity 2302a outside of the periphery of die 802a. Ball interconnect 3002a overlaps thick film material 2202 (not indicated in FIG. 33) outside of a periphery of cavity 2302a.

In FIGS. 31 and 33, ball interconnects 3002a-3002c are formed as part of a 3 by 3 array of ball interconnects 3002 for each of dies 802a and 802b. Arrays of ball interconnects 3002 of any size may be present relating to a particular die 802, depending on a number of redistribution interconnects 1602 that are present, including hundreds of ball interconnects 3002. Ball interconnects 3002 may be formed of any suitable electrically conductive material, including a metal such as a solder or solder alloy, copper, aluminum, gold, silver, nickel, tin, titanium, a combination of metals/alloy, etc. Ball interconnects 3002 may have any size and pitch, as desired for a particular application. Ball interconnects 3002 may be any type of ball interconnect, including a solder ball, a solder bump, etc. Ball interconnects 3002 may be formed in any manner, including sputtering, plating, lithographic processes, etc., as would be known to persons skilled in the relevant art(s). Ball interconnects 3002 are used to interface resulting wafer-level packages with an external device, such as a PCB.

Figure 34:
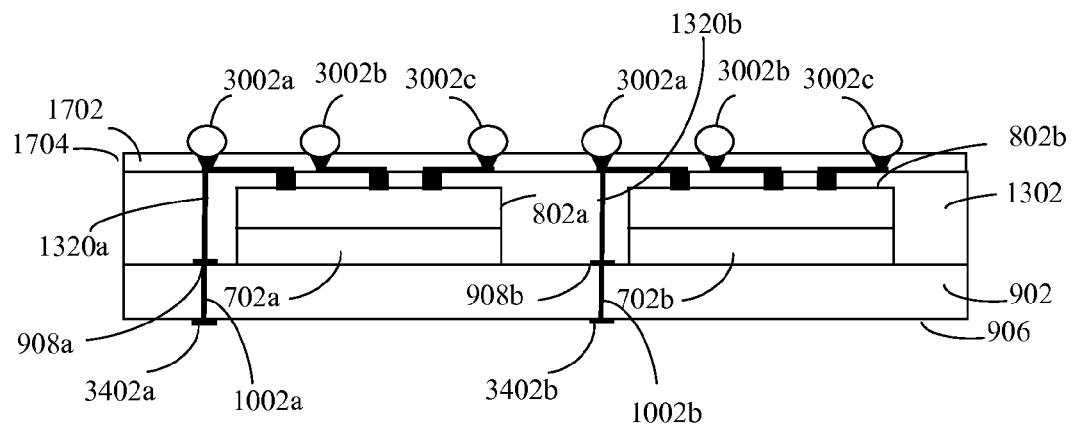
FIG. 34 shows a cross-sectional view of the structure of FIG. 30, with first and second electrically conductive features formed on the substrate, according to an example embodiment.

In step 2906, a second plurality of electrically conductive features is formed on a second surface of the substrate. For example, FIG. 34 shows a cross-sectional view of the structure of FIG. 30, with first and second electrically conductive features 3402a and 3402b formed on second surface 906 of substrate 902. As shown in FIG. 34, a first end of electrically conductive path 1002a is coupled to electrically conductive feature 3402a, and a first end of electrically conductive path 1002b is coupled to electrically conductive feature 3402b. As such, electrically conductive path 1320a, electrically conductive feature 908a, electrically conductive path 1002a, and electrically conductive feature 3402a form a first electrical connection through insulating material 1302 and substrate 902, electrically coupling a ball interconnect 3002a to a terminal of die 802a and to electrically conductive feature 3402a. Electrically conductive path 1320b, electrically conductive feature 908b, electrically conductive path 1002b, and electrically conductive feature 3402b form a second electrical connection through insulating material 1302 and substrate 902, electrically coupling a ball interconnect 3002a to a terminal of die 802b and to electrically conductive feature 3402b. Electrically conductive features 3402 may be formed on substrate 902 in any manner, including in the manner described above for electrically conductive features 908 (e.g., in any shape, including traces/routing, via capture pads (e.g., circular) aligned with an axis of a conductive path 1002, etc.).

Figure 35:
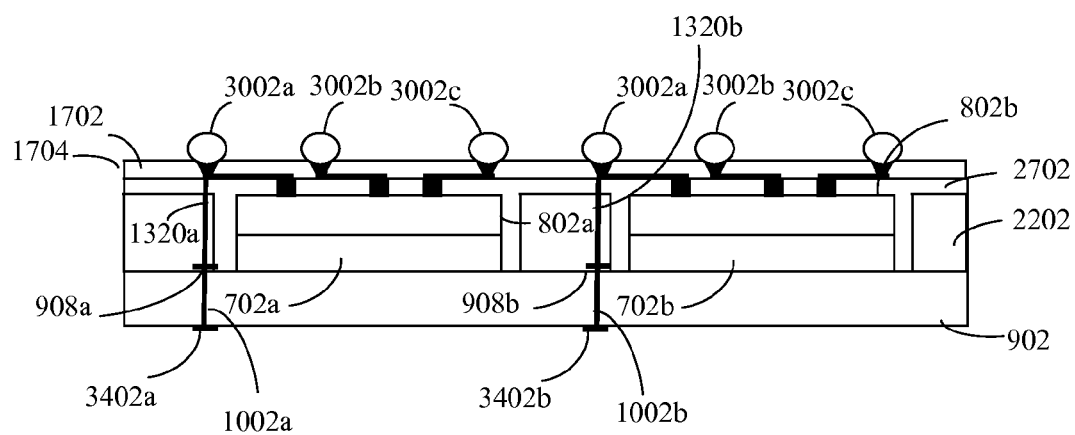
FIG. 35 shows a cross-sectional view of the structure of FIG. 32, with first and second electrically conductive features formed on the substrate, according to an example embodiment.

Similarly, FIG. 35 shows a cross-sectional view of the structure of FIG. 32, with first and second electrically conductive features 3402a and 3402b formed on second surface 906 of substrate 902. Electrically conductive path 1320a, electrically conductive feature 908a, electrically conductive path 1002a, and electrically conductive feature 3402a form a first electrical connection through insulating material 2702, thick film material 2202, and substrate 902, electrically coupling a ball interconnect 3002a to a terminal of die 802a and to electrically conductive feature 3402a. Electrically conductive path 1320b, electrically conductive feature 908b, electrically conductive path 1002b, and electrically conductive feature 3402b form a second electrical connection through insulating material 2702, thick film material 2202, and substrate 902, electrically coupling a ball interconnect 3002a to a terminal of die 802b and to electrically conductive feature 3402b.

In step 2908, the dies are singulated into a plurality of integrated circuit packages that each include a die and the portion of the space adjacent to the included die. Dies 802 may be singulated/diced in any appropriate manner to physically separate the dies from each other, as would be known to persons skilled in the relevant art(s). Singulation according to step 2908 may result in 10s, 100s, 1000s, or even larger numbers of integrated circuit packages, depending on a number of dies 802 that are present. Dies 802 may be singulated by a saw, router, laser, etc., in a conventional or other fashion. Referring to FIG. 34, dies 802 may be singulated by cutting through first and second insulating material layers 1302 and 1702, and substrate 902, to separate dies 802 from each other, with each die 802 including a portion of its adjacent space. Referring to FIG. 35, dies 802 may be singulated by cutting through first and second insulating material layers 2702 and 1702, thick film material 2202, and substrate 902, to separate dies 802 from each other, with each die 802 including a portion of its adjacent space.

Figure 36:
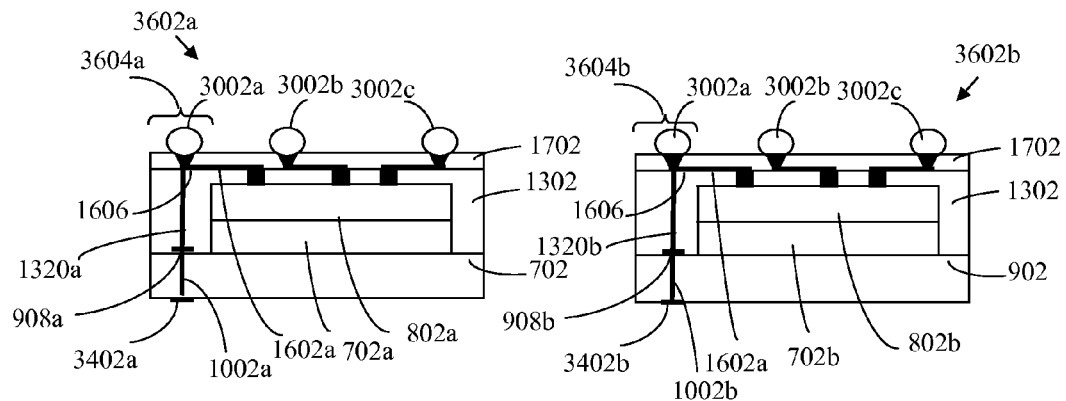
FIGS. 36-38 shows views of integrated circuit packages singulated from the structure of FIG. 34, according to example embodiments.

For example, FIG. 36 shows a cross-sectional view of the structure of FIG. 34 having been singulated into first and second packages 3602a and 3602b. Integrated circuit packages 3602a and 3602b respectively include dies 802a and 802b, and respective portions 3604a and 3604b of adjacent space that are filled with insulating material 1302. Second portions 1606 of redistribution interconnects 1602*a* extend over portions 3604*a* and 3604*b* of the adjacent space included with singulated dies 802*a* and 802*b*, respectively.

Figure 37:
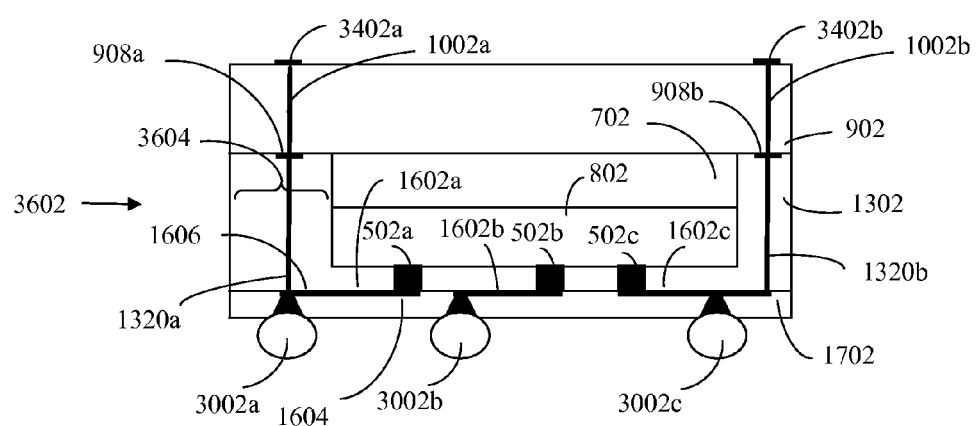

FIG. 37 shows a cross-sectional view of an integrated circuit package 3602, which has been inverted relative to FIG. 36. Furthermore, package 3602 includes a first interconnection structure that includes electrically conductive path 1320*a*, electrically conductive feature 908*a*, electrically conductive path 1002*a*, and electrically conductive feature 3402*a*, and a second interconnection structure that includes electrically conductive path 1320*b*, electrically conductive feature 908*b*, electrically conductive path 1002*b*, and electrically conductive feature 3402*b*. Any number of such interconnection structures may be present in a package to form an electrical connection through the package that is also coupled to a terminal of the included die. Package 3602 may be formed in the manner that packages 3602*a* and 3602*b* of FIG. 36 are formed (e.g., according to flowcharts 300, 1100, and 2900). Alternatively, package 3602 may be formed by other fabrication process, including by forming package 3602 individually. As shown in FIG. 36, package 3602 includes die 802, which has a plurality of terminals 502*a*-502*c* on a first surface, insulating material 1302, redistribution interconnects 1602*a*-1602*c*, and ball interconnects 3002*a*-3002*c*. Insulating material 1302 covers the active surface of die 802, and fills space 3404 adjacent one or more sides of die 802. Redistribution interconnect 1602*a* on insulating material 1302 has first portion 1604 coupled to terminal 502*a* of die 802 through insulating material 1302, and has second portion 1606 that extends away from first portion 1604 over insulating material 1302. Ball interconnect 3002*a* is coupled to second portion 1606 of redistribution interconnect 1602*a* over space 3404. Thus, redistribution interconnect 1602 effectively expands an area of die 802 for attachment of ball interconnects.

Figure 38:
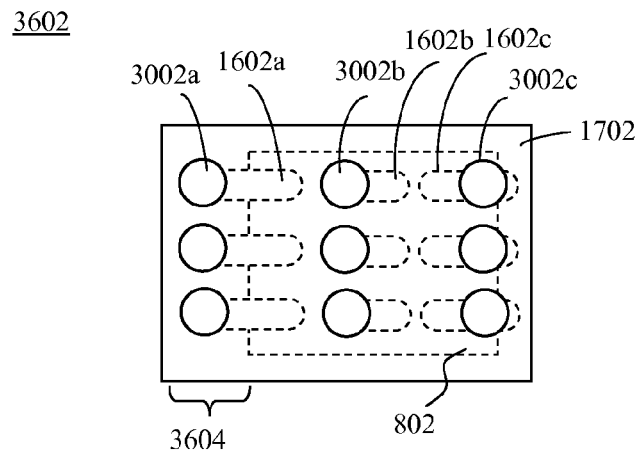

FIG. 38 show a bottom view of package 3602, where ball interconnects 3002*a*-3002*c* form a portion of a 3 by 3 array of ball interconnects 3002. Ball interconnects 3002 are used to attach package 3402 to a circuit board. As shown in FIG. 36, three ball interconnects 3002, including ball interconnect 3002*a*, are coupled through redistribution interconnects 1602, such as redistribution interconnect 1602*a*, to terminals of die 802. Furthermore, the three ball interconnects 3002 are over space 3604 adjacent to die 802. Thus, the area of die 802 is effectively increased by an area of space 3604 for attachment of three additional ball interconnects 3002. Embodiments of the present invention enable the attachment of any number of ball interconnects 3002, depending on the particular implementation, as would be known to persons skilled in the relevant art(s) from the teachings herein.

Figure 39:
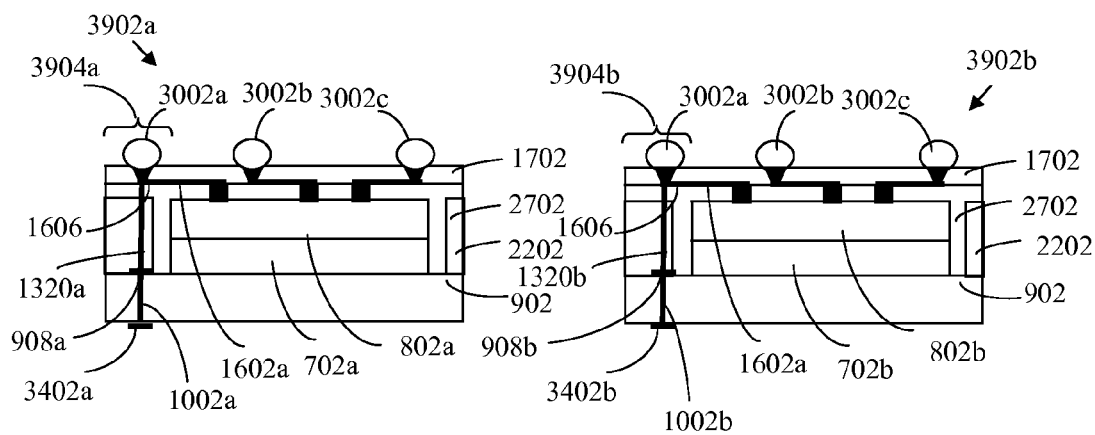
FIGS. 39-41 shows views of integrated circuit packages singulated from the structure of FIG. 35, according to example embodiments.

FIG. 39 shows a cross-sectional view of the structure of FIG. 35 having been singulated into first and second packages 3902*a* and 3902*b*. Integrated circuit packages 3902*a* and 3902*b* respectively include dies 802*a* and 802*b*, and respective portions 3904*a* and 3904*b* of adjacent space that are filled with insulating material 2702, and which may further include thick film material 2202. Second portions 1606 of redistribution interconnects 1602*a* extend over portions 3904*a* and 3904*b* of the adjacent space included with singulated dies 802*a* and 802*b*, respectively.

Figure 40:
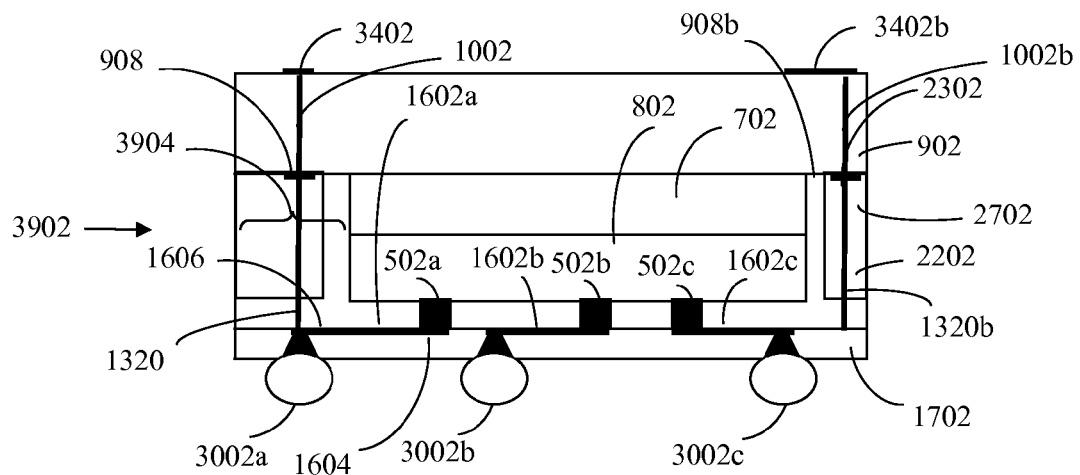

FIG. 40 shows a cross-sectional view of an integrated circuit package 3902, which has been inverted relative to FIG. 39. Furthermore, package 3902 includes a first interconnection structure that includes electrically conductive path 1320*a*, electrically conductive feature 908*a*, electrically conductive path 1002*a*, and electrically conductive feature 3402*a*, and a second interconnection structure that includes electrically conductive path 1320*b*, electrically conductive feature 908*b*, electrically conductive path 1002*b*, and electrically conductive feature 3402*b* (electrically conductive feature 3402*b* is elongated in FIG. 40 to extend away from an edge of package 3902). Any number of such interconnection structures may be present in a package to form an electrical connection through the package that is also coupled to a terminal of the die. Integrated circuit package 3902 is an example wafer-level package, formed according to an embodiment of the present invention. Package 3902 may be formed in the manner that packages 3902a and 3902*b* of FIG. 39 are formed (e.g., according to flowcharts 300, 2000, and 2900). Alternatively, package 3902 may be formed by other fabrication process, including by forming package 3902 individually. As shown in FIG. 40, package 3902 includes die 802, which has a plurality of terminals 502*a*-502*c* on a first surface, insulating material 2702, thick film material 2202, redistribution interconnects 1602*a*-1602*c*, and ball interconnects 3002*a*-3002*c*. Insulating material 2702 covers the active surface of die 802, and fills space 3904 adjacent one or more sides of die 802 in opening 2302 formed by thick film material 2202. Thick film material 2202 may form a partial or complete ring around die 802. Redistribution interconnect 1602*a* on insulating material 2702 has first portion 1604 coupled to terminal 502*a* of die 802 through insulating material 2702, and has second portion 1606 that extends away from first portion 1706 over insulating material 2702 and thick film material 2202. Ball interconnect 3002*a* is coupled to second portion 1606 of redistribution interconnect 1602*a* over space 3904. Thus, redistribution interconnect 1602 effectively expands an area of die 802 for attachment of ball interconnects.

Figure 41:
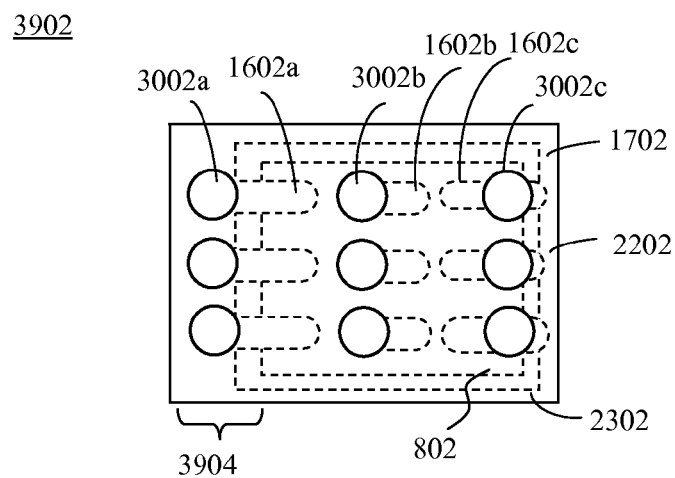

FIG. 41 show a bottom view of package 3902, where ball interconnects 3002*a*-3002*c* form a portion of a 3 by 3 array of ball interconnects 3002. Ball interconnects 3002 are used to attach package 3902 a circuit board. As shown in FIG. 41, three ball interconnects 3002, including ball interconnect 3002*a*, are coupled through redistribution interconnects 1602, such as redistribution interconnect 1602*a*, to terminals of die 802. Furthermore, the three ball interconnects 3002 are over space 3904 adjacent to die 802. Thus, the area of die 802 is effectively increased by an area of space 3904 for attachment of three additional ball interconnects 3002. Embodiments of the present invention enable the attachment of any number of ball interconnects 3002, depending on the particular implementation, as would be known to persons skilled in the relevant art(s) from the teachings herein.

Figure 42:
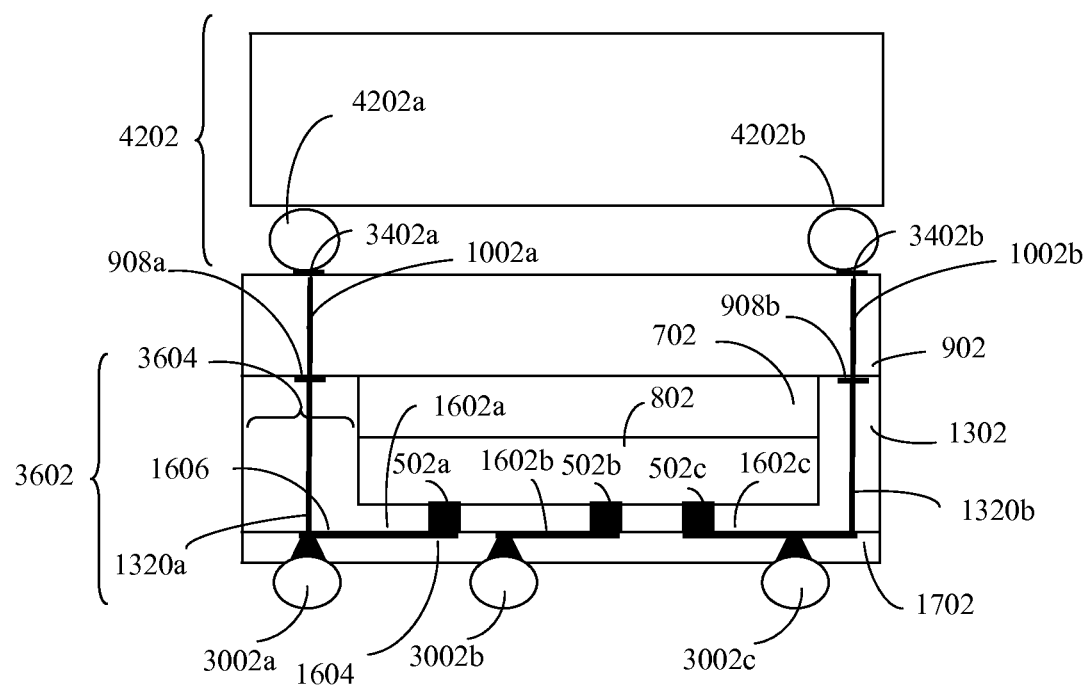
FIGS. 42 and 43 show example package-on-package structures, according to example embodiments of the present invention.

In step 2910, a second integrated circuit package is mounted to each of the plurality of first integrated circuit modules to form a plurality of package-on-package structures. Integrated circuit packages formed according to embodiments described herein, such as package 3602 (FIG. 36-38) and package 3902 (FIGS. 39-41), may have a second integrated circuit package mounted to them, to form a package on package structure. For example, FIG. 42 shows an example package-on-package structure 4200, according to an example embodiment of the present invention. Structure 4200 is an integrated circuit package that includes package 3602 as a first package, and includes a second integrated circuit package 4202 that is mounted to package 3602. Package 4202 may be any type of integrated circuit package, including a ball grid array package, a pin grid array package, a land grid array package, etc. For example, as shown in FIG. 42, package 4202 includes first and second mounting members 4202*a* and 4202*b* (e.g., pins, posts, or solder balls as shown in FIG. 42) that are attached to electrically conductive features 3402*a* and 3402b on second surface 906 of substrate 902 of package 3602. Any number of mounting members 4202 may be present in package 4202 that are attached to a corresponding number of electrically conductive features 3402 of package 3602. Package 4202 may be attached to package 3602 in any manner, including using a pick-and-place apparatus, reflow soldering, etc.

As such, an electrical connection is formed between terminal 502a of die 802, ball interconnect 3002a, and mounting member 4202 by electrically conductive path 1320a, electrically conductive feature 908a, electrically conductive path 1002a, and electrically conductive feature 3402a, to electrically couple an electrical signal between package 3602, package 4202, and a circuit board to which structure 4200 is mounted (using ball interconnects 3002). Any number of electrical signals may be coupled between package 3602 and package 4202 in this manner.

Figure 43:
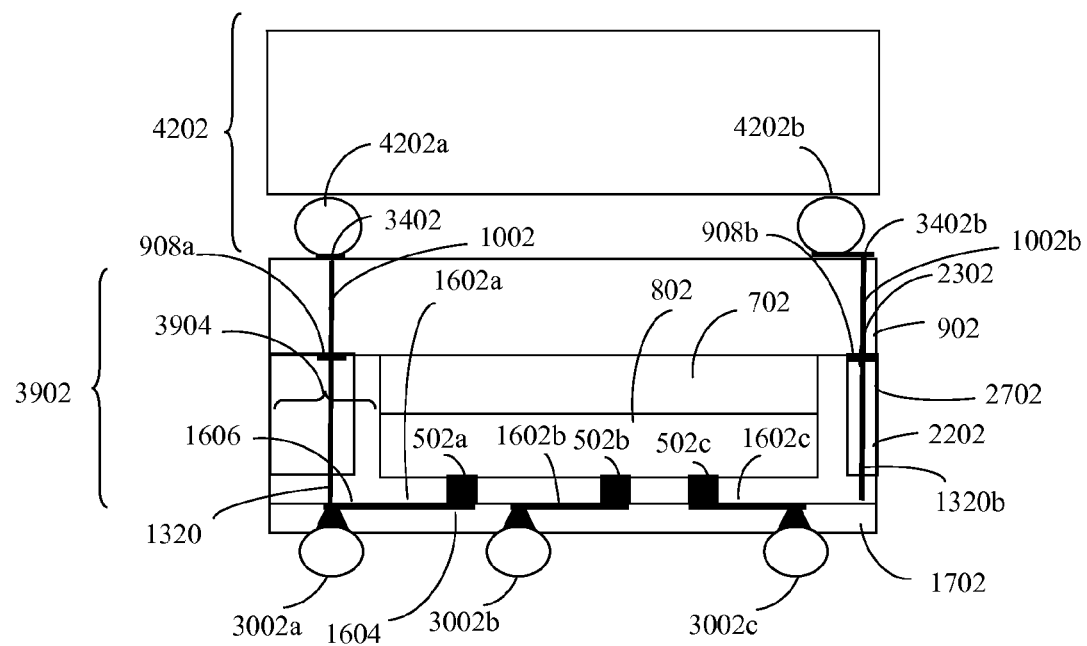

In a similar manner, FIG. 43 shows an example package-on-package structure 4300, according to an example embodiment of the present invention. Structure 4300 is an integrated circuit package that includes package 3902 as a first package, and includes second integrated circuit package 4202, which is mounted to package 3902. For example, as shown in FIG. 43, package 4202 includes first and second mounting members 4202a and 4202b that are attached to electrically conductive features 3402a and 3402b on second surface 906 of substrate 902 of package 3902. Any number of mounting members 4202 may be present in package 4202 that are attached to a corresponding number of electrically conductive features 3402 of package 3902. Package 4202 may be attached to package 3902 in any manner, including using a pick-and-place apparatus, reflow soldering, etc.

As such, an electrical connection is formed between terminal 502a of die 802, ball interconnect 3002a, and mounting member 4202 by electrically conductive path 1320a, electrically conductive feature 908a, electrically conductive path 1002a, and electrically conductive feature 3402a, to electrically couple an electrical signal between package 3902, package 4202, and a circuit board to which structure 4300 is mounted (using ball interconnects 3002). Any number of electrical signals may be coupled between package 3902 and package 4202 in this manner.

Thus, embodiments enable a Package-on-Package approach to achieving integration of additional devices into wafer-level technologies to create new/additional functionality without incurring additional area penalty in the end-use application. Examples of additional functionality include adding a logic/mixed signal chip, adding a memory chip, and/or adding any further type of chip (enclosed in a second package) to a package embodiment described herein. Embodiments enable Package-on-Package to be used with the fan-out wafer-level packaging technology.

V. Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents

What is claimed is:

1. An integrated circuit (IC) package structure, comprising:
   a fan-out wafer level integrated circuit package that includes
   an integrated circuit die having a plurality of terminals on a first surface of the integrated circuit die,
   a semiconductor material substrate having opposing first and second surfaces, the first surface of the semiconductor material substrate having a first electrically conductive feature, the second surface of the substrate having a second electrically conductive feature, the semiconductor material substrate having a first electrically conductive path through the semiconductor material substrate from the first electrically conductive feature to the second electrically conductive feature, a second surface of the integrated circuit die being attached to the first surface of the semiconductor material substrate, the semiconductor material substrate being a portion of a semiconductor wafer,
   a first layer of an insulating material that covers the first surface of the die and the first electrically conductive feature, and fills a space adjacent to at least one side of the die on first surface of the semiconductor material substrate, the first layer being a single layer of the insulating material,
   a second electrically conductive path through the insulating material coupled to the first electrically conductive feature,
   a wafer level redistribution interconnect on the first layer of the insulating material that has a first portion coupled to a terminal of the die through the first layer and a second portion that extends away from the first portion over the space adjacent to the die that is filled by the insulating material, the second portion being coupled to the second electrically conductive path, and
   a ball interconnect coupled to the second portion of the wafer level redistribution interconnect, wherein the ball interconnect is configured to be coupled to a printed circuit board such that the first surface of the integrated circuit die faces the printed circuit board; and
   an integrated circuit package mounted to the fan-out wafer level integrated circuit package.

2. The IC package structure of claim 1, wherein the fan-out wafer level integrated circuit package further includes:
   a substantially planar thick film material attached to the first surface of the semiconductor material substrate that forms an opening;
   wherein the integrated circuit die is positioned in the opening on the first surface of the semiconductor material substrate; and
   wherein the first layer of insulating material covers the first surface of the die, the first electrically conductive feature, and a surface of the thick film material, and fills a space adjacent to the die in the opening.

3. The IC package structure of claim 1, wherein the fan-out wafer level integrated circuit package further includes:
   a plurality of first vias through the first layer of the insulating material to provide access to the plurality of terminals;
   wherein the first portion of the wafer level redistribution interconnect is coupled to the terminal of the die through a corresponding first via.

4. The IC package structure of claim 3, wherein the fan-out wafer level integrated circuit package further includes:
a second layer of insulating material over the first layer of insulating material and the wafer level redistribution interconnect; and
a second via through the second layer of insulating material to provide access to the second portion of the wafer level redistribution interconnect;
wherein the ball interconnect is coupled to the second portion of the wafer level redistribution interconnect through the second via.

5. The IC package structure of claim 4, wherein the fan-out wafer level integrated circuit package further includes:
an under bump metallization layer on the second layer of insulating material in contact with the second portion of the wafer level redistribution interconnect though the second via;
wherein the ball interconnect is coupled to the second portion of the wafer level redistribution interconnect through the under bump metallization layer and the second via.

6. The IC package structure of claim 1, wherein the integrated circuit package mounted to the fan-out wafer level integrated circuit package includes:
a plurality of electrical mounting members, including a first electrical mounting member that is attached to second electrically conductive feature.

7. The IC package structure of claim 1, wherein the integrated circuit package mounted to the fan-out wafer level integrated circuit package is a ball grid array (BGA) package.

8. The IC package structure of claim 2, wherein the second electrically conductive path is also through the thick film material.

9. A fan-out wafer level integrated circuit package structure, comprising:
a semiconductor material substrate having opposing first and second surfaces, the semiconductor material substrate including a first plurality of electrically conductive features on the first surface of the substrate that are coupled by a first plurality of electrically conductive paths through the semiconductor material substrate to a second plurality of electrically conductive features on the second surface of the semiconductor material substrate;
a plurality of integrated circuit dies that each include an integrated circuit region, wherein a non-active surface of each die of the plurality of dies is attached to the first surface of the semiconductor material substrate;
a single layer of wafer level insulating material that covers the dies on the semiconductor material substrate and the first plurality of electrically conductive features, and fills a space adjacent to at least one side of each of the plurality of integrated circuit dies attached to the first surface of the semiconductor material substrate;
a second plurality of electrically conductive paths through the single layer of the insulating material; and
a plurality of wafer level redistribution interconnects on the single layer of the insulating material, wherein the plurality of wafer level redistribution interconnects includes a wafer level redistribution interconnect for each die of the plurality of dies having a first portion coupled to a terminal of a respective die and a second portion that extends away from the first portion over the space adjacent to the respective die that is filled by the single layer of the insulating material, the second portion being coupled to an electrically conductive path of the second plurality of electrically conductive paths and being configured to be coupled to a printed circuit board such that an active surface of a die of the plurality of dies that opposes a non-active surface of the die faces the printed circuit board.

10. The structure of claim 9, further comprising:
a layer of a thick film material formed on the first surface of the semiconductor material substrate having a plurality of openings formed therein;
wherein the non-active surface of each die of the plurality of dies is attached to the first surface of the semiconductor material substrate in a corresponding opening; and
wherein the single layer of the insulating material covers the dies in the openings on the semiconductor material substrate.

11. The structure of claim 10, wherein the second plurality of electrically conductive paths is formed through the single layer of the insulating material and the thick film material.

12. The structure of claim 9, further comprising:
a ball interconnect coupled to each second portion.

13. An integrated circuit (IC) package structure, comprising:
a fan-out wafer level integrated circuit package that includes
an integrated circuit die having a terminal on a first surface of the integrated circuit die that is an access point for an electrical signal,
a semiconductor material substrate having opposing first and second surfaces, the first surface of the semiconductor material substrate having a first electrically conductive feature, the second surface of the semiconductor material substrate having a second electrically conductive feature, the semiconductor material substrate having a first electrically conductive path through the semiconductor material substrate from the first electrically conductive feature to the second electrically conductive feature, a second surface of the integrated circuit die being attached to the first surface of the semiconductor material substrate, the semiconductor material substrate being a portion of a semiconductor wafer,
a first layer of an insulating material that covers the first surface of the die and the first electrically conductive feature, and fills a space adjacent to at least one side of the die on first surface of the semiconductor material substrate, the first layer being a single layer of the insulating material,
a second electrically conductive path through the insulating material coupled to the first electrically conductive feature,
a wafer level redistribution interconnect on the first layer of the insulating material that has a first portion coupled to the terminal of the die through the first layer and a second portion that extends away from the first portion over the space adjacent to the die that is filled by the insulating material, the second portion being coupled to the second electrically conductive path, and
a ball interconnect coupled to the second portion of the wafer level redistribution interconnect, wherein the ball interconnect is configured to be coupled to a printed circuit board such that the first surface of the integrated circuit die faces the printed circuit board;
wherein the second electrically conductive feature is configured to receive a mounting member of an other integrated circuit package.

14. The IC package structure of claim 13, wherein the fan-out wafer level integrated circuit package further includes:
- a substantially planar thick film material attached to the first surface of the semiconductor material substrate that forms an opening;
- wherein the integrated circuit die is positioned in the opening on the first surface of the semiconductor material substrate; and
- wherein the first layer of insulating material covers the first surface of the die, the first electrically conductive feature, and a surface of the thick film material, and fills a space adjacent to the die in the opening.

15. The IC package structure of claim 13, wherein the fan-out wafer level integrated circuit package further includes:
- a plurality of first vias through the first layer of the insulating material to provide access to a plurality of terminals on the first surface of the integrated circuit die;
- wherein the first portion of the wafer level redistribution interconnect is coupled to the terminal of the die through a corresponding first via.

16. The IC package structure of claim 15, wherein the fan-out wafer level integrated circuit package further includes:
- a second layer of insulating material over the first layer of insulating material and the wafer level redistribution interconnect; and
- a second via through the second layer of insulating material to provide access to the second portion of the wafer level redistribution interconnect;
- wherein the ball interconnect is coupled to the second portion of the wafer level redistribution interconnect through the second via.

17. The IC package structure of claim 16, wherein the fan-out wafer level integrated circuit package further includes:
- an under bump metallization layer on the second layer of insulating material in contact with the second portion of the wafer level redistribution interconnect though the second via;
- wherein the ball interconnect is coupled to the second portion of the wafer level redistribution interconnect through the under bump metallization layer and the second via.

18. The IC package structure of claim 13, wherein the other integrated circuit package includes:
- a plurality of electrical mounting members, including a first electrical mounting member that is attached to second electrically conductive feature.

19. The IC package structure of claim 13, wherein the other integrated circuit package is a ball grid array (BGA) package.

20. The IC package structure of claim 14, wherein the second electrically conductive path is also through the thick film material.

* * * * *